United States Patent [19]

Sliwa, Jr.

[11] Patent Number: 5,075,253

[45] Date of Patent: Dec. 24, 1991

[54] METHOD OF COPLANAR INTEGRATION OF SEMICONDUCTOR IC DEVICES

[75] Inventor: John W. Sliwa, Jr., Palo Alto, Calif.

[73] Assignee: Advanced Micro Devices, Inc., Sunnyvale, Calif.

[21] Appl. No.: 581,510

[22] Filed: Sep. 12, 1990

Related U.S. Application Data

[62] Division of Ser. No. 337,223, Apr. 12, 1989, Pat. No. 4,990,462.

[51] Int. Cl.$^5$ .............................................. H01L 25/04
[52] U.S. Cl. .................................... 437/209; 437/211; 437/51; 437/208; 437/915; 437/90; 357/75
[58] Field of Search .................. 437/209, 211, 51, 208, 437/915, 90; 357/75

[56] References Cited

U.S. PATENT DOCUMENTS

| 3,301,716 | 9/1964 | Kleinknecht . | |
|---|---|---|---|
| 3,870,850 | 3/1975 | Larionov et al. | 219/85 |
| 3,961,415 | 6/1976 | Davis, Jr. | 437/209 |
| 4,322,737 | 3/1982 | Sliwa, Jr. | 357/82 |
| 4,542,397 | 9/1985 | Biegelsen et al. | 357/32 |
| 4,709,468 | 12/1987 | Wilson | 437/209 |
| 4,818,728 | 4/1989 | Rai et al. | 437/209 |
| 4,843,035 | 6/1989 | Takashima | 437/209 |
| 4,907,062 | 3/1990 | Fukushima | 357/75 |

FOREIGN PATENT DOCUMENTS

2144907 3/1985 United Kingdom ................ 437/209

OTHER PUBLICATIONS

An electrochemical P-N Junction Etch-Stop for the Formation of Silicon Microstructures, T. N. Jackson, M. A. Tishler, and K. D. Wise, 02/81, IEEE Electron Device Letters, vol. EDL-2, pp. 44-45.

Anodic Dissolution of N+ Silicon, Ronald L. Meek, 03/71, J. Electrochem. Soc.: Electrochemical Science, pp. 437-442.

Fluxless and Virtually Voidless Soldering for Semiconductor Chips, Ken'ichi Mizuichi, Masahide Tokuda, & Yuuji Fujita, 12/88, IEEE Transactions on Components, Hybrids, and Manufacturing Technology, vol. II, No. 4, pp. 447-451.

Vertical Etching of Silicon at Very High Aspect Ratios, Don L. Kendall, Annual Review of Mat. Sci., 9, pp. 373-403, 1979.

*Primary Examiner*—Brian E. Hearn
*Assistant Examiner*—Gordon V. Hugo
*Attorney, Agent, or Firm*—Benman & Collins

[57] ABSTRACT

A high degree of wafer-scale integration of normally incompatible IC devices is achieved by providing a plurality of segments (10), each segment having thereon one or more circuits, circuit elements, sensors and/or I/O connections (14'). Each segment is provided with at least one edge (12) having an abutting portion (12a) capable of abutting against a similar edge of a neighboring segment. The segments are placed on the surface of a flotation liquid (20) and are allowed to be pulled together so as to mate abutting edges of neighboring segments, thereby forming superchips (10'). Microbridges (22) are formed between neighboring segments, such as by solidifying the flotation liquid, and interconnections (26) are formed between neighboring segments. In this manner, coplanar integration of semiconductor ICs is obtained, permitting mixed and normally incompatible circuit functions on one pseudomonolithic device as diverse as silicon and III-V digital circuits, III-V optoelectronic devices, static RAMs, charge coupled devices, III-V lasers, superconducting thin films, ferromagnetic non-volatile memories, high electron mobility transistors, and bubble memories, to name a few, to be integrated in any desired combination. The yieldable scale of integration of a given device technology is also greatly extended. The segments are brought together in a particulate-free fashion with high throughput and exacting reproducibility at low cost.

8 Claims, 13 Drawing Sheets

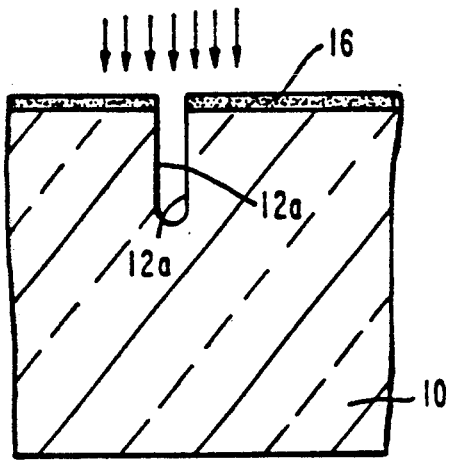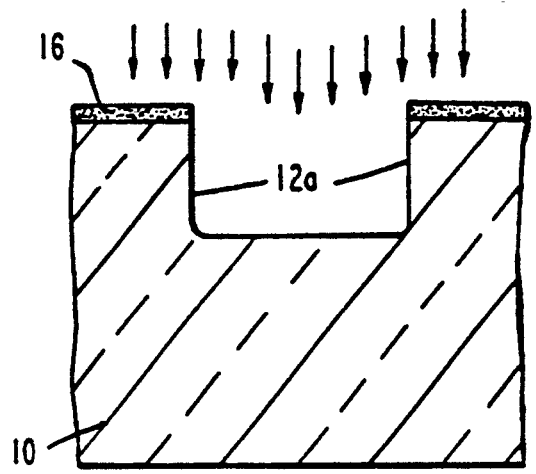
Fig. 3a.     Fig. 3a'.
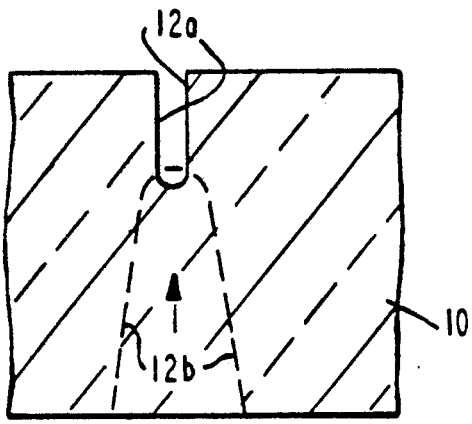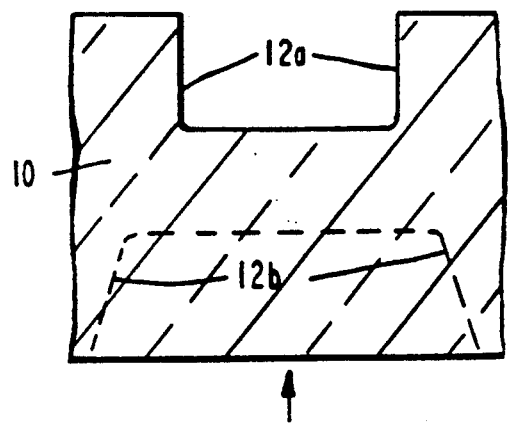
Fig. 3b.     Fig. 3b'.
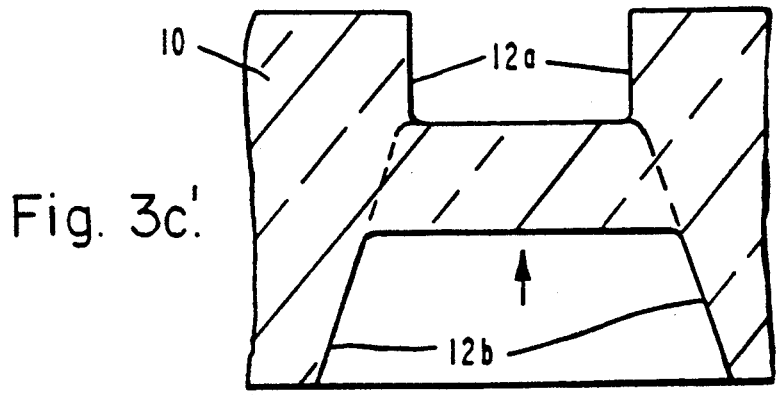
Fig. 3c'.

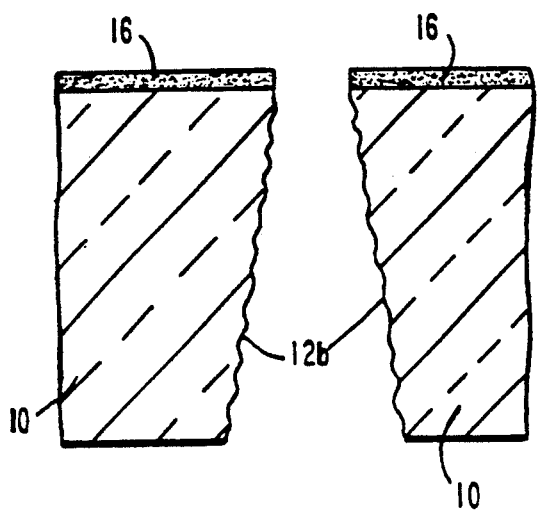
Fig. 3a."
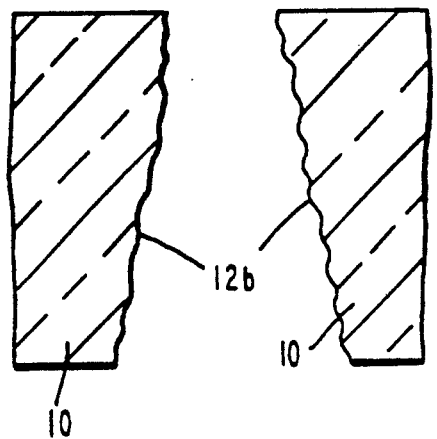
Fig. 3a.'''
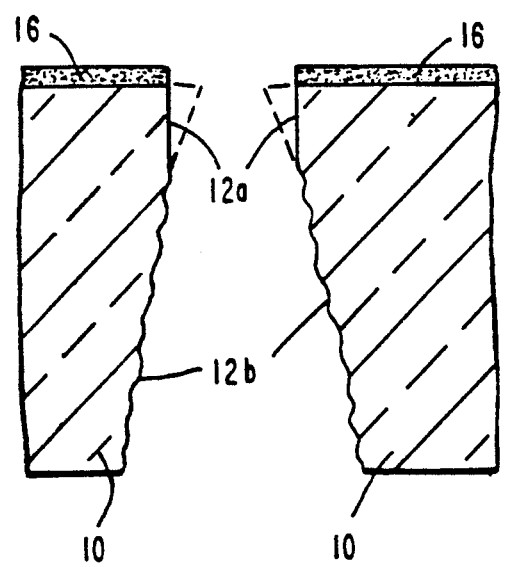
Fig. 3b."
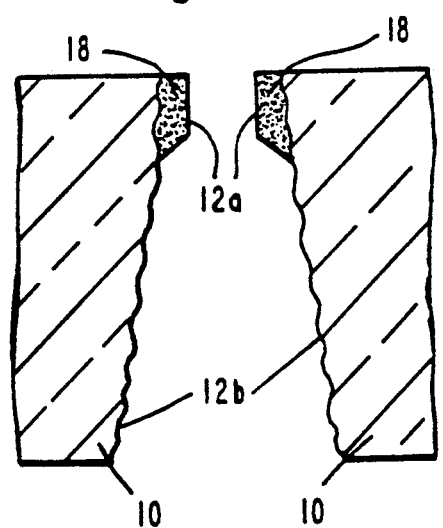
Fig. 3b.'''

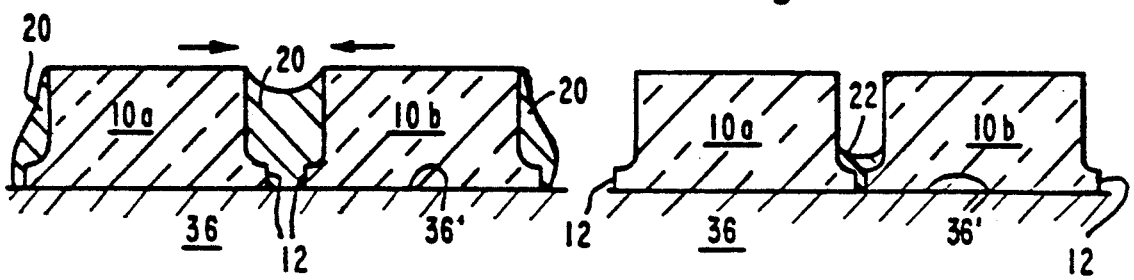
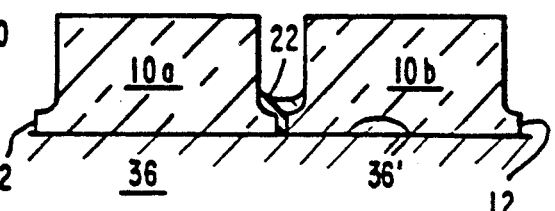
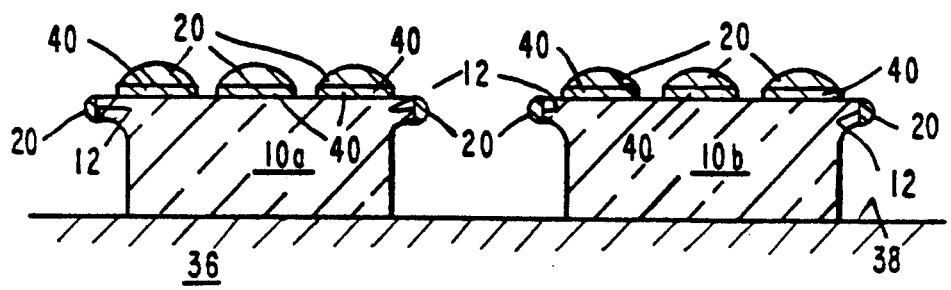
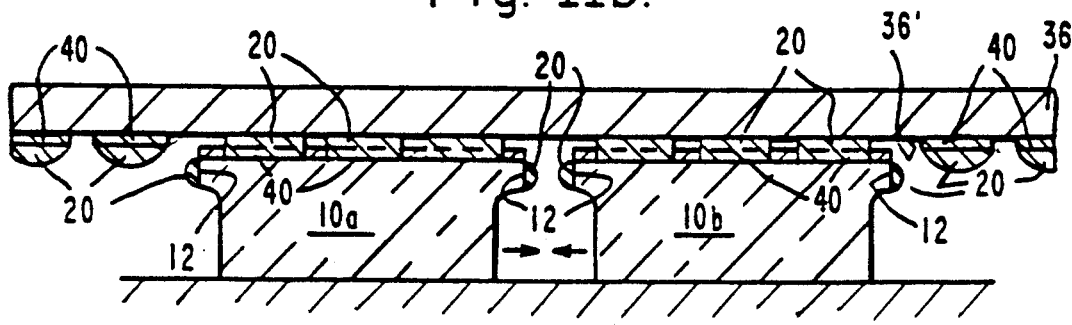
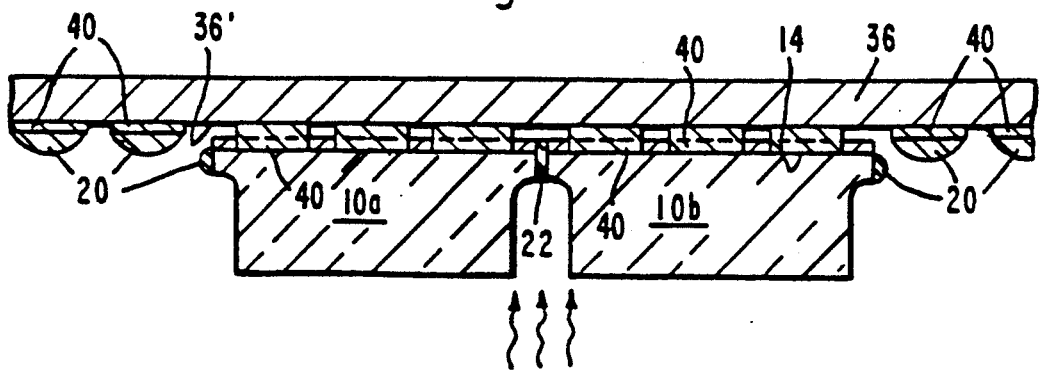

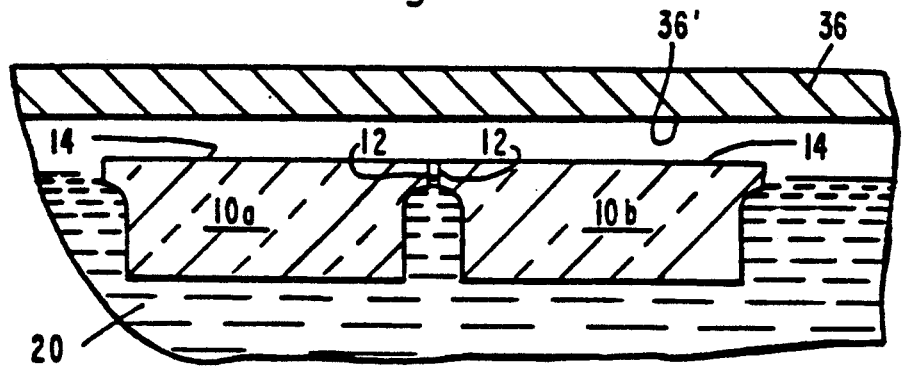
Fig. 12a.
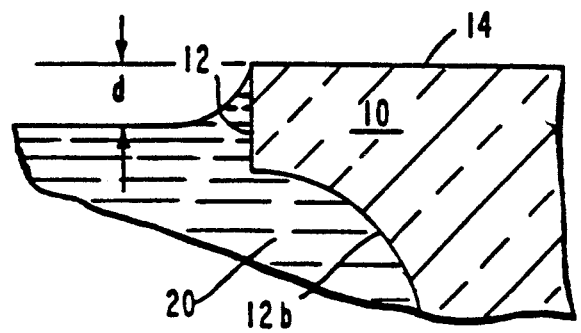
Fig. 12a.'
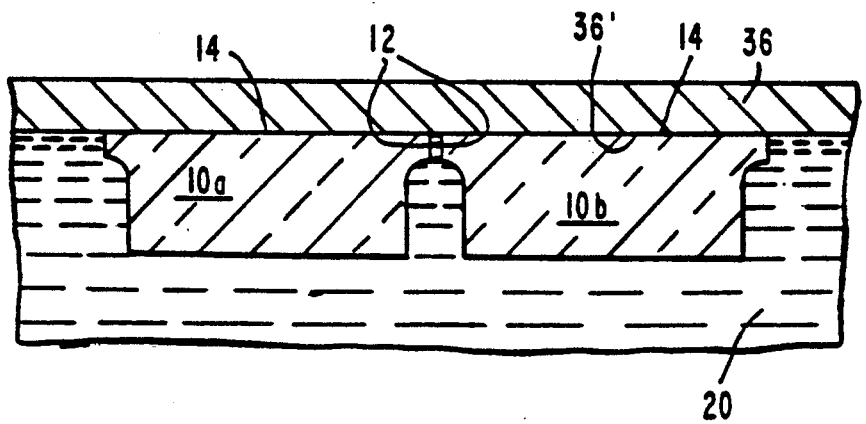
Fig. 12b.
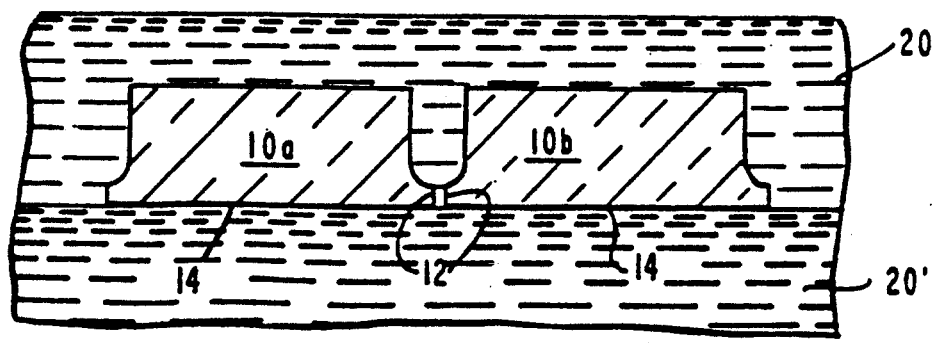
Fig. 13.

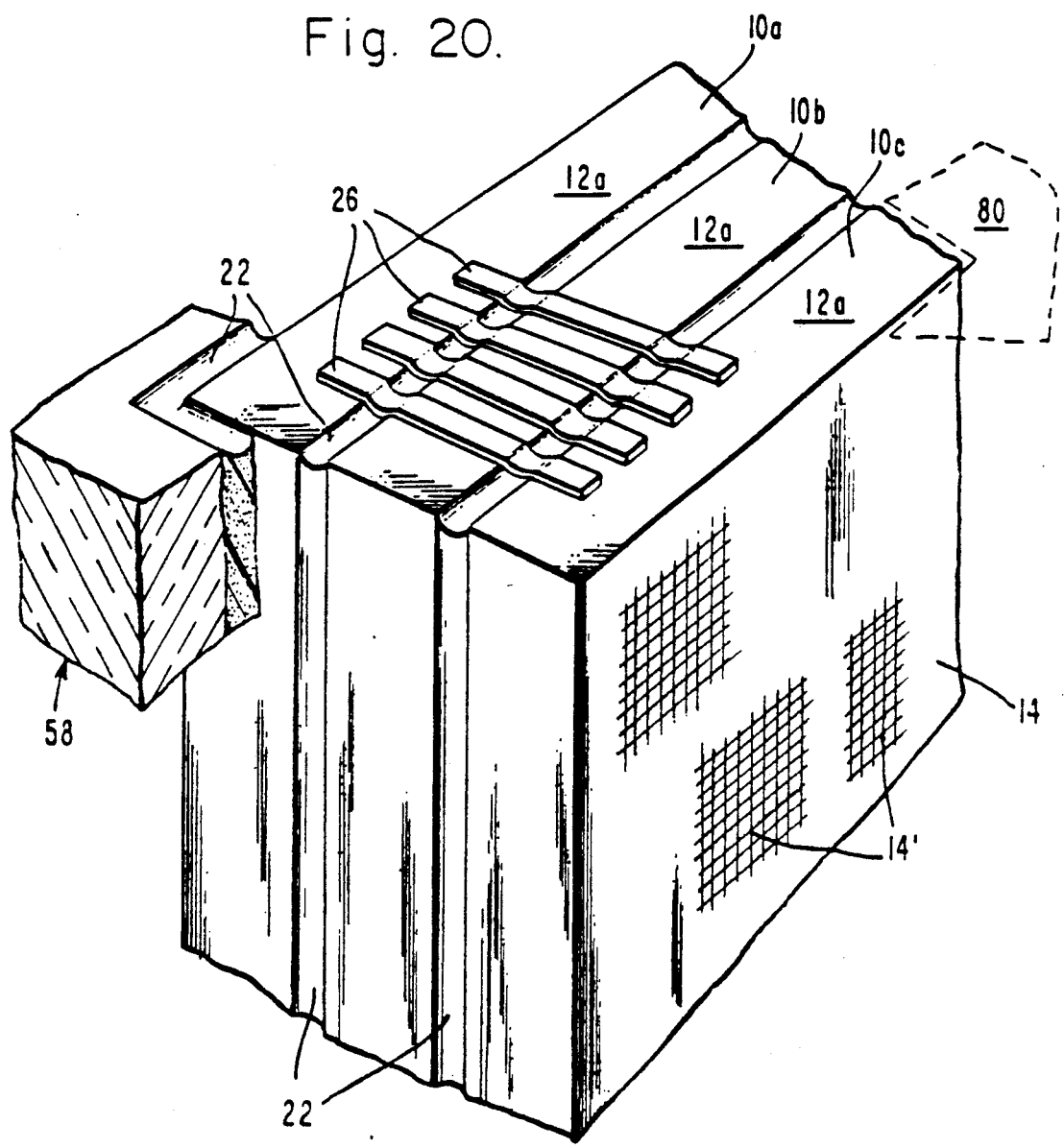

METHOD OF COPLANAR INTEGRATION OF SEMICONDUCTOR IC DEVICES

This is a division of application Ser. No. 07/337,223, filed Apr. 12, 1989.

BACKGROUND OF THE INVENTION

1. Field of the Invention

The present invention relates to semiconductor devices, and, more particularly, to forming multisegment "superchips", employing coplanar integration of a plurality of individual segments, each segment having formed thereon various circuits and circuit elements.

2. Description of the Related Art

Although the cost of designing increasingly complex integrated circuit (IC) devices continues to drop such that extremely complex products can now be designed on a desktop workstation, the cost of manufacturing these devices as measured by the required investment in capital equipment and ultra-clean rooms is rising at an astronomical pace. The continued decreases in circuit feature-size and simultaneous increases in chip size in order to get more functional capability on each chip is making it extremely difficult to maintain profitable yields. The Poisson yield model $Y = \exp(-DA)$, where Y is fractional yield, D is the net fatal defect density per unit area, and A is the chip area, gives a reasonably good fit to the behavior of yield as a function of those two parameters. Since this is an exponential relationship, one can see that any increase in either chip area A or defect density D has severe negative yield and profitability impact. Profitability is hurt because the cost of processing a wafer of chips is constant regardless of how many chips are good or bad.

The net fatal defect density, usually expressed in terms of fatal defects/cm$^2$ of chip area, takes a dramatic upturn as the size of a chip's features are reduced unless extraordinary measures are taken to reduce the source of such defects. In general, a fatal defect would typically be caused by a particulate whose size is some fatal fraction of the smallest feature size found on the chip. As examples, a state-of-the-art chip may have 0.8 µm spaces between its metallic interconnects. Those closely spaced interconnects can certainly be shorted by a 0.8 µm particle or by an agglomeration of smaller particles situating themselves in the narrow spaces. The same chip may have a 200 Å or 150 Å gate oxide whose growth can certainly be interfered with by the presence of a contaminant whose size is on the same order of magnitude as the oxide thickness, i.e. 150 Å. In fact, a few monolayers of contaminant can cause problems. Thus, enormously expensive ongoing measures are required just to maintain constant defect density D, let alone decrease D, as features get smaller. The number of competitors able to afford the investments required to do this is rapidly dwindling, while the remaining manufacturers increasingly seek government funding to help in this undertaking. Countries not having this ability are in strategic trouble.

As mentioned above, the defect density will rise drastically with circuit feature-size shrinking unless great efforts are made to clean up the manufacturing environment, tools, people, and consumable materials. Other obvious variables which influence defect density are the number of process steps involved and the individual cleanliness of each of those steps as they are integrated together as well as the quality of the monolithic substrate starting-material employed to manufacture the devices. Historically, there has been substantial pressure to simplify process-complexity in order to improve yields. Simplification means using fewer and simpler process steps less prone to defect generation. There has also been substantial resistance to the widespread use of better higher-performance substrate materials such as gallium arsenide because such new materials frequently incorporate more inherent crystalline defects than silicon and are more fragile, which limits yields.

Independent of the concerns about defects and yields are the disadvantages of monolithic chips relative to their process inflexibility. As an example, consider the presently separate silicon chip industry and gallium-arsenide chip industry. Gallium arsenide's strengths are its inherent speed and ability to easily provide either optoelectronic or digital devices at modest levels of integration. Silicon's relative strengths are its slower yet useful speed and its inherently high level of achievable integration due to lower process and substrate defect densities and lower power density.

At present, it is impossible to combine both materials in one monolithic substrate and simultaneously build silicon and gallium arsenide digital circuits along with optoelectronic gallium arsenide devices without resorting to exceedingly complex defect-prone gallium arsenide-on-silicon epitaxial techniques. Such techniques have yet to integrate more than a handful of devices for military purposes where cost is no object. Without using molecular beam and other epitaxial techniques well-known in the art, the goal cannot be reached even for that very simplistic level of integration. It is to be understood that the level of integration possible in such work is many orders of magnitude cruder than in silicon technology wherein one million devices can be commercially integrated today.

Numerous telecommunication and computing applications await the solution to the problem of achieving mixed technology VLSI. In many cases, it would be highly advantageous, in terms of performance, to execute silicon digital designs completely in gallium arsenide, but silicon devices incorporating 100,000 gates or more will have extremely poor yields with the inherently more defect-prone gallium arsenide material and processes. Thus, not only cannot one achieve VLSI in mixed technologies, but it is virtually impossible to achieve VLSI in straight gallium arsenide in large million-device chips like those made of silicon today.

The list of attractive products which could be made possible if defect density were not such a dramatic limiter of yield and if one could easily monolithically combine the benefits of presently incompatible or unacceptably-complex process-technology combinations is endless. In the area of memory devices, one could construct presently unyieldable ultrafast static random access memories (RAMs) of multimegabit density at low cost in gallium arsenide. In the area of sensors, one could construct presently unyieldable silicon charge-coupled device (CCD) imaging chips of several million pixels and thus obtain electronic images of fine photographic quality. In the area of microprocessors, one could obtain supercomputer performance on a single, very large chip incorporating silicon memory and gallium-arsenide logic. Numerous incompatible technologies such as semiconductor gallium-arsenide lasers, optical detectors, superconducting thin films and devices, ferromagnetic nonvolatile memories, combinations of microwave and conventional digital/analog devices, high electron mobility transistors (HEMT), quantum devices, power devices, and bubble memories could each contribute to overall, uncompromised solutions implemented on one chip. An array of present system-level limitations such as chip-to-chip propagation delays, clock skew between devices and reliability and cost disadvantages associated with multichip solutions could be overcome by replacing multiple incompatible chips with one chip.

The closest that existing technology can presently come to the above is with hybrid-circuit techniques. In short, the printed circuit board is replaced with a far smaller ceramic substrate to which the same chips are attached. The ceramic substrate, essentially an ultra-fine-line printed circuit board, permits the chips to be packaged closer together and permits the on-substrate incorporation of passive elements such as laser-trimmed resistors and capacitors. This does improve the performance and reliability relative to a printed circuit board technique, but the cost is extremely high and the performance is still far from that of a single-chip solution. Lately, the trend is toward replacing the ceramic substrate with a silicon substrate which can be manufactured on the same equipment as the chips themselves. Thus, the interconnect linewidths are reduced to about 10 $\mu$m for controlled impedance in this more compact implementation, rather than the larger linewidths measured in thousandths of inches (0.001) typical of ceramic substrates. Even in this approach, the interconnections made between the chips and the substrate are far larger in scale than the inherent feature size of the chips themselves. The signals passing between such chips pass out of a microscopic world (on-chip) into a relatively macroscopic world (on-substrate) and then back onto some neighboring chip. Having to deal with the inductance and capacitance discontinuities and having to optimize the transmission-line behavior of these signal passages results in performance degradations relative to a one-chip solution. Needless to say, the reliability impact of a multichip hybrid approach such as this is also quite negative relatively speaking because in a one-chip solution one does not have to employ chip-to-substrate solder microjoints which are much more unreliable (and much more expensive) than on-chip thin film interconnections.

At present, there is no available method which will permit the manufacture of wafer-scale devices incorporating any desired mix of process technologies. There is not even a manufacturable wafer-scale device limited to one process technology which does not grossly compromise performance due to extensive use of redundancy. The only conceivable approach to currently building a single process logic/memory wafer-scale device would have to incorporate extensive use of redundant backup circuits. The problem with these approaches and other similar discretionary wiring approaches is that the more redundancy one employs to obtain yield, the further one gets from the performance of the most compact implementation, that of a yielding non-redundant device. This is particularly true for logic devices, and since increasingly most application-specific device types employ logic devices, the argument is qualitatively correct in general.

The objective of the presently disclosed invention is to permit chip manufacturers to reduce the impact of the exponential yield law such that they can both yield much larger chips at a given fixed feature size and defect density or conversely build much denser chips (smaller feature size) at a fixed chip size in spite of higher defect density. Likewise, such manufacturers would be able to combine various process and device technologies in any desired manner regardless of their present monolithic incompatibility. The present invention does not eliminate the benefit of defect density reduction; it simply greatly extends the scale and complexity of what is manufacturable at any given fixed defect density.

It must be emphasized that the objective of this invention is not to create an improved higher-density multichip hybrid whereon interchip connections must still pass from chip to substrate to chip and are still of a scale and density considerably below that of the chips themselves and large spaces are necessary between such chips such that they can be mounted, tested, reworked or otherwise individually processed. Rather, the primary objective is to implement all such chips in one chip. This will be done in a manner such that the result is identically physically equivalent to all of the circuitry being monolithically implemented. The strategy is to make the superchip in pieces and put it together. If one makes such a superchip of total area A in N pieces, then the area of each piece, or segment, becomes A/N. Thus, the yield of each of the individual unassembled segments becomes $Y_s = \exp(-DA/N)$ The yield of joining an incremental segment to a superchip being assembled must be high, i.e., nearly unity, and can be assigned on a perincremental segment basis as $Y_j$. For a superchip containing N segments, the total superchip yield based on the total area of substrate material processed can be written as the product of the unassembled segment yields and the yielded segment-joining operations used to assemble the good segments. Since the first segment is not joined until a second segment is presented for the first joining operation, then the total joining yield is $Y_j^{N-1}$. This represents how often one can successfully execute all of the segment joining operations within a given superchip. The total segment yield in the simplest case wherein all N segments are identical is $\exp(-DA/N)$. Thus, $Y_{superchip}$, just like the yield of today's monolithic devices, is a measure of how much starting material is successfully yielded. Accordingly, the product of the fractional portion of material which yields good unassembled segments and the probability of those good segments being successfully assembled represents the superchip yield as well as the efficiency of yielding the original raw material.

$$Y_{superchip} = \underbrace{(Y_j^{N-1})}_{\text{joining yield}} \underbrace{\exp(-DA/N)}_{\text{before-joining yield}}$$

The yield improvement due to the segmented approach is simply $$\frac{Y_{superchip}}{Y} = \frac{(Y_j^{N-1}) \exp(-DA/N)}{\exp(-DA)} = Y_j^{N-1} e^{DA(1-1/N)}$$

Obviously, for values of DA which are realistic, i.e., at least unity, values of N of only 3 or greater and values of $Y_j$ of 0.95 (i.e. 95%), then the yield improvement by segmentation can be at least 75% (i.e., the ratio is 1.75). For more likely applications, DA would be much larger, say 5 to 10, giving improvements in yield for three segments of from 2500% (ratio=25) to 70,800% (ratio=708). For the same two cases if the number of segments is increased from N=3 to N=6, then the improvements range from 5,000% (ratio=50) to 322,000% (ratio =3,220). Thus, it becomes possible not only to obtain acceptable yields for any size superchip but to freely mix technologies among the segments.

The obvious challenge is how one can possibly hope to align and join such segments in a manufacturing environment in high volume. Just the task of aligning two such segments even in one direction on a submicrometer-accuracy scale is complex and requires exotic micromanipulation devices. What is required is three-dimensional X,Y,Z and $\theta$ (angle) matchup on N segments simultaneously, and then the implementation of a joining interconnection process on a scale equivalent to that of the device features themselves with very high yields and low built-in stress. Thus, not only is it required to simultaneously mechanically manipulate N segments in three dimensions, but it also is required to do so in an ultra-clean, non-defectproducing manner. This is inconceivable, given present technology, the severe defect restrictions, and the required throughput needs necessary for any commercially successful product.

The only direct attempt to pseudomonolithically build chips from segments known to the present inventor and which claims to result in chips whose assembled segments are essentially indistinguishable from the monolithic approach is that of Biegelsen et al, U.S. Pat. No. 4,542,397. Biegelsen et al partially address only the alignment issue, but not the joining and defect issues.

The approach of Biegelsen et al has four deficiencies, two of which are fatal. The first fatal deficiency is that the invention requires that the wafers employed be of <110> axial orientation semiconductor crystal, a seldom-used orientation not desirable in integrated circuit manufacturing, wherein <100> material is exclusively used in order to minimize built-in gate oxide charges and carrier mobility anisotropies in silicon devices. The approach of Biegelsen et al will not give vertical chip edges in the <100> material most commonly used. One is limited, even in <110> material, to chip shapes which follow his latent crystal planes.

The second fatal deficiency for the Biegelsen et al approach is that segments such as those defined by Biegelsen et al are ultrafragile in that they consist of brittle semiconductor materials with razor-sharp edges and no methodology is presented which will keep those edges from damaging each other. Even the slightest mechanical contact of two segments with any velocity appreciably above zero will produce particulate debris and edge damage. Such debris will foul the smooth motion and joining alignment required. Such damage and debris will prevent the implementation of submicrometer intersegment interconnections. Although Biegelsen et al suggest employing a grooved surface plate into whose surface such debris can fall, the damage to the integrity of the edges is already done. Furthermore, the active device surface in the approach of Biegelsen et al must be face-up on their vibrating table or it will be damaged. Thus, chip segments of different thickness cannot easily be joined due to their height mismatch.

The debris described above will also cause defects in the later patterning of the intersegment interconnections. It must be emphasized the defects produced by the segments and energetic forceful segment-alignment mechanics described by Biegelsen et al are just the opposite of what chip-manufacturers are spending billions of dollars to attain, i.e., ultra-clean, particulate-free operations with no instances of mechanical abrasion or tribologically-produced debris. Any contact with the product must be highly controlled, reproducible and clean, and preferably not contact the active device surface at all.

Biegelsen et al suggest that their grooved plate will catch the debris, but submicrometer debris is more affected by electrostatic and turbulence effects than it is by gravity. Wafer manufacturers have to use very aggressive cleaning techniques not amenable to such segments to remove such debris from wafers.

Two additional serious deficiencies are 1) the limited segment shapes available and resulting geometric difficulty of simultaneously abutting an array of diamond-shaped segments and 2) the fact that Biegelsen et al say nothing in detail about how to interconnect the segments as formed using their technique once they are abutted and only reference one to other patents, such as U.S. Pat. No. 3,870,850 and U.S. Pat. No. 3,301,716, which do not appear to even be remotely applicable to the task. This is hardly a trivial matter, as Biegelsen et al clearly imply. The present invention describes the important issues of gap control and differential expansion not discussed or referred to by Biegelsen et al.

If one has ever taken square pieces of tile and placed them on a flat surface and tried to simultaneously compact them into a large square array with no gaps, one notes how easy it is for even one badly aligned segment to ruin the fit of the entire array. This is especially true for four-sided segments. The only solution is to compact them one at a time, which greatly slows down the process, especially if each one has to be individually manipulated mechanically. Arrays whose segment-edges fall on common lines passing all the way through the superchip will always have this binding problem, especially if the segments are gravitated or shaken and slid together in the manner of Biegelsen et al. The accumulation of tolerances, i.e., segment size variations, can also cause binding problems in such arrays. The approach of Biegelsen et al is not conducive to evenly distributing tolerance variations over the whole array.

Further, the three-dimensional alignment accuracy of the Biegelsen et al approach is limited by the defects produced during the intersegment dry-contacting and dry-sliding events which takes place numerous uncontrollable times and by the nature of some potentially particulateladen reference surface on which their segments lie. From the figures of Biegelsen et al, one cannot even conclude whether or not they employ the device-surface to lie against the reference surface (upside down), thus permitting segments of different thickness typical of the thickness variation between wafers but introducing damage directly to the active device surfaces. Their alternative, as mentioned, is to have the segments sit face-up, in which case, any segment thickness variation will not allow the chip edges to match. As noted herein, the defect particles and corresponding edge-damage produced in the Biegelsen et al approach will not only interfere with micrometer-scale alignment due to binding and debris between and under segments, but will also interfere with the later formation of intersegment interconnections because portions of the segment edges are missing on the scale of the interconnects to be implemented (i.e., about one micrometer or less).

References to "closely abutting" integrated-circuitry constructed on multiple independent bodies of semiconductor material are undoubtedly numerous. As an example, U.S. Pat. No. 4,322,737, issued Mar. 30, 1982, to Jack Sliwa and assigned to INTEL Corp. clearly shows such a concept in FIGS. 17a and 21. However, this reference, like so many others, is not specifically designed to implement micrometer-scale intersegment interconnections, so all of the particulate and edge damage issues are ignored and no particular claims relating to micrometerscale extendability are made.

SUMMARY OF THE INVENTION

In accordance with the invention, the extraordinary difficulty and defect-prone task of bringing all the segments together in perfect 3-dimensional alignment and in perfect particulate-free fashion with high throughput and exacting reproducibility at low cost is achieved by the innovative use of a liquid surface-tension driven flotation and assembly mechanism. In essence, the segments pull themselves together to minimize surface tension and in so doing, the liquid self-limits and hydrodynamically damps the maximum forces to which the segments are exposed. During the operation, the flotation agent liquid lubricates the segments and provides a mechanism to remove any unlikely particulates which might be produced. It also serves to actually float or at least lubricate the segment faces in applications wherein a reference plate is used to force the segment topsides to be coplanar. The flotation liquid, or an additional liquid film floating on the flotation liquid itself, or another liquid presented later after alignment is achieved and the flotation liquid is removed, constitutes the permanent bridge required between abutting segments after a solidification sequence takes place. The liquid is cured or solidified in place after it spontaneously forms microbridges across the intersegment gaps. The microbridge shape is controlled by the liquid surface tension and is highly reproducible.

In order to initially form segments by defining the segment edges, an applicable combination of dry-etching, laser-machining and wafer-sawing is employed, giving complete shape freedom. The segment formation method of Biegelsen et al, which is known art, is also applicable for the few applications wherein <110> axial orientation material can be utilized. A second segment formation method is described also.

Other objects, features and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIGS. 3a-3b, 3a'-3c', 3a"-3b", 3a'"-3b'" illustrate several approaches to attaining such an edge profile as depicted in FIG. 2;

FIGS. 10a and 10b show the application of the process in such a way that the segments never actually float but the liquid still pulls the segments together and lubricates their movement from remote locations;

FIGS 11a-c are side elevational views showing the application of the process in such a way that the segments (a) again have their prospective abutting edges prewetted by the agent liquid such that when the opposing edge bead meniscuses touch each other, such surface tension will again pull them laterally together, and (b) the segments (before they actually undergo the lateral surface-tension driven assembly at the time when they contact each other) are rendered mobile by being suspended from or on a reference plate such that they can be brought into meniscuscontact by external means with minimal required force;

FIGS. 12a and 12b are side elevational views showing an arrangement similar to the floated assembly of FIGS. 4a and 4b, but with the additional feature that an externally applied flat reference substrate insures absolute coplanarity before microbridge solidification;

FIG. 12a' is an enlargement of a portion of FIG. 12a;

FIG. 13 is a side elevational view showing a flotation assembly approach wherein the segments are actually floating in a liquid-liquid interface between two liquids, either top-side up or top-side down;

FIG. 20 shows several segments stacked on edge brought into initial but controlled position by the same liquid manipulation approach; intersegment interconnect traces are shown formed on the edges of the stacked segments as opposed to across the edges of the two-dimensional array of segments. In this scheme, each large intersegment wetted interface would have isolated wettable sections such that all the liquid does not flow to one corner and such that the gaps can be reproduced.

DETAILED DESCRIPTION OF THE INVENTION

Reference is now made in detail to a specific embodiment of the present invention, which illustrates the best mode presently contemplated by the inventor for practicing the invention. Alternative embodiments are also briefly described as applicable.

Figure 1:
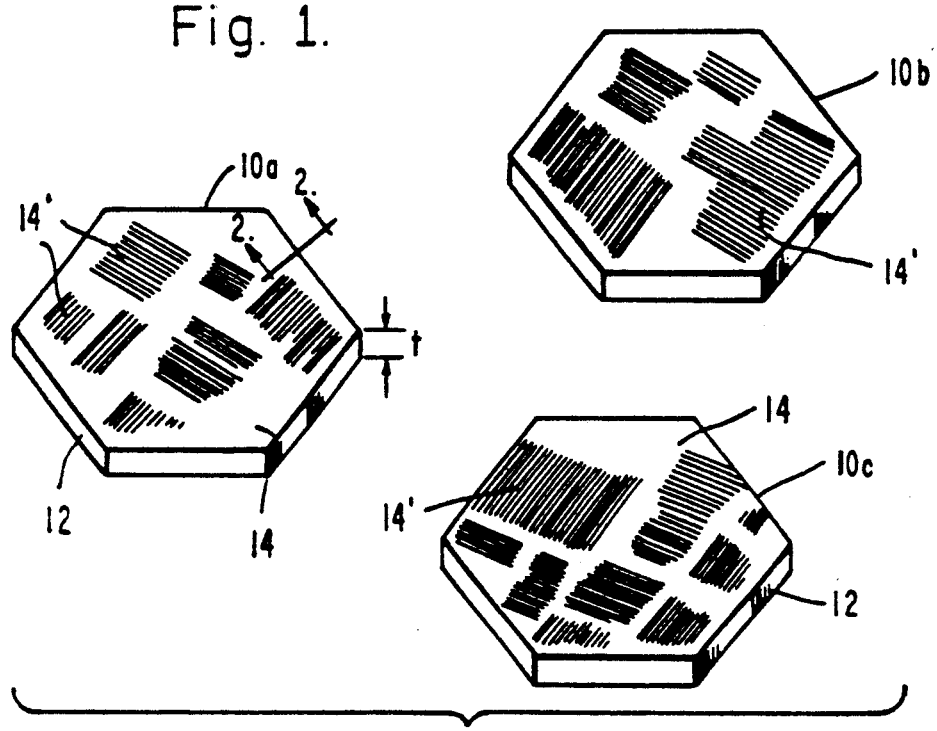
FIG. 1 is a perspective view depicting three segments to be joined to form a superchip.
Figure 2:
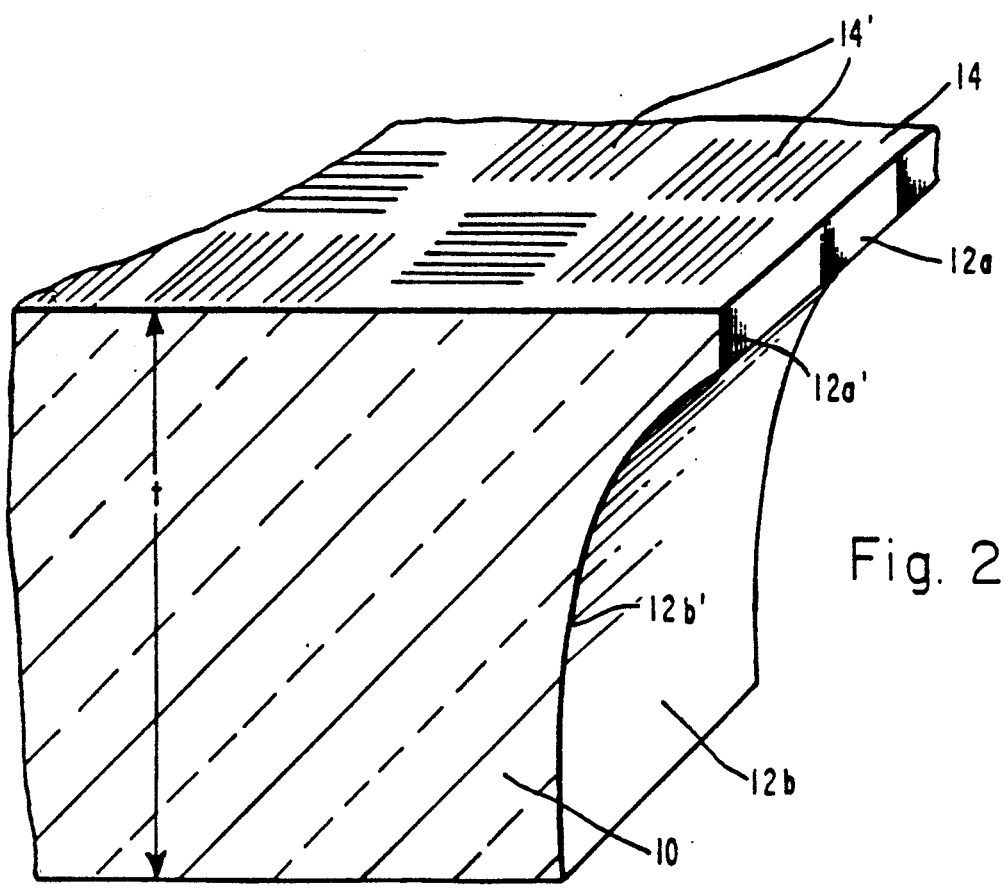
FIG. 2 is a perspective view showing the required edge profile for each segment taken along section 2—2 of FIG. 1.

FIG. 1 depicts three hexagonal segments 10a-c, each of thickness t, which are to be mated together along their edges 12. Each edge has a critical abutting portion 12a, as well as a non-critical, non-abutting portion 12b, as shown in greater detail in FIG. 2. It is the 12a surface which is employed to control the final fit of the segment array. The non-abutting portion 12b of edge 12 is simply a mechanical relief region and is not required to contribute to intersegment alignment. It will be noted in FIG. 2 that the edge portion 12a need only be a small fraction of the total edge area 12. Although none of the Figures is to scale, the potentially relatively small portion 12a is properly depicted with respect to edge 12; however, the edge portion used by 12a can be up to 100% of the edge 12. Edges 12a must be flat and smooth to a degree such that the abutment will be sufficiently accurate. For an application wherein 1 μm intersegment connections are implemented on a 2 μm pitch, the accuracy and smoothness requirements of edges 12a will be a fraction of 1 μm.

In FIG. 1, the top surface 14 of each segment 10 is provided with circuitry 14'. Such circuitry is formed by prior art procedures and thus is not further described herein, except to note that it may comprise any of the circuitry features discussed above. As used herein, "IC" is used broadly to include analog and digital integrated circuits, light emitting diodes (LEDs), solid state lasers, transducers, and other semiconductor-based microminiature devices and elements, whether active (e.g., transistors) or passive (e.g., resistors and connectors), employing silicon, gallium arsenide, or other semiconductor material.

FIG. 3 addresses accuracy and smoothness wherein is depicted the use of anisotropic reactive ion etching (RIE) or electron-cyclotron resonance reactive ion etching (ECR-etching) to form the critical edge surfaces 12a. It is to be noted that such equipment is readily available and capable of etching such slots or trenches with aspect ratios greater than 20 to 1. Typically, an etcher such as the Applied Materials 5000 Trench-Etcher would be used. An etch mask 16 may consist of only photoresist or of a hard oxide mask or metal mask which is pre-defined using a resist mask. Another possibility for etching the alignment surfaces 12a is excimer laser etching.

Once the surfaces 12a have been formed in the parent wafers of each segment type, then it is necessary to separate those segments by creating the relief defined by non-critical edge areas 12b. This may be done in several manners, as depicted in FIG. 3.

The scheme depicted in FIGS. 3a and 3b utilizes a wafer-sawing step or excimer laser etching step to create the surfaces 12b from the underside of the segment parent wafers. The scheme depicted in FIGS. 3a', 3b', and 3c' is similar but involves etching a wider slot to form surfaces 12a and using a wafer saw to cut most of the way through from the underside and finally using an excimer laser to machine away the remaining web of material. In FIG. 3c', the removal of the final remaining material after topside reactive ion etching and underside wafer sawing may be accomplished by the excimer laser either from above or below. In FIG. 3b', one would employ a bottomside wafer-saw cut (or kerf) of width sufficiently large to overlap the topside trench width as defined by walls 12a.

Given the greater width of the topside cut to form surface 12a and the backside (underside) cut to form the first parts of surface 12b relative to the scheme depicted in FIGS. 3a and 3b, there is enough room to finish up the separation task using the excimer laser or other desirable laser operating at an ideal non-vertical illumination direction.

FIG. 3 does not depict numerous other ways of arriving at a similar edge 12, including utilizing the excimer laser to etch all the way through the segment parent wafers from one or both sides. On the other hand, another approach would be to wafer-saw all the way through the wafer from the bottomside using a tapered blade. This would result in segment edges 12 as shown in FIGS. 3a" and 3b". In FIG. 3b" can be seen the application of laser machining from above to define surfaces 12a after roughforming them in FIG. 3a".

In FIGS. 3a" and 3b", the primary purpose of mask 16 is to prevent redeposition of the evaporated molten chip semiconductor material onto the active device areas 14'. This is a widely used approach in laser-marking of IC devices. It must be emphasized that edge portion 12a does not necessarily need to be located adjacent active device surface 14 and could be located anywhere on edge 12, including at the bottom edge.

Yet another viable approach to forming critical edge abutment surfaces 12a is shown in FIGS. 3a''' and 3b'''. In this scheme, one merely roughly defines edge 12 with etching or other means and then builds-up a portion of the edge using a photodefinable polymer 18 such as photosensitive polyimide. The advantage of this approach is that there is no ultraprecise etching or cutting of the chip segment edges required. The precise edge is lithographically made of a cantilevered segment of structural photosensitive polyimide. The edge definition is done from above with exposure and development of the polymer in the usual and normal manner. To compensate for shrinkage during curing of the polymer, surfaces 12a may be trimmed using an excimer laser. The other advantage of the approach depicted in FIGS. 3a''' and 3b''' is that edges 12a are reworkable as well as non-fragile relative to semiconductive substrate material.

Figure 4A:
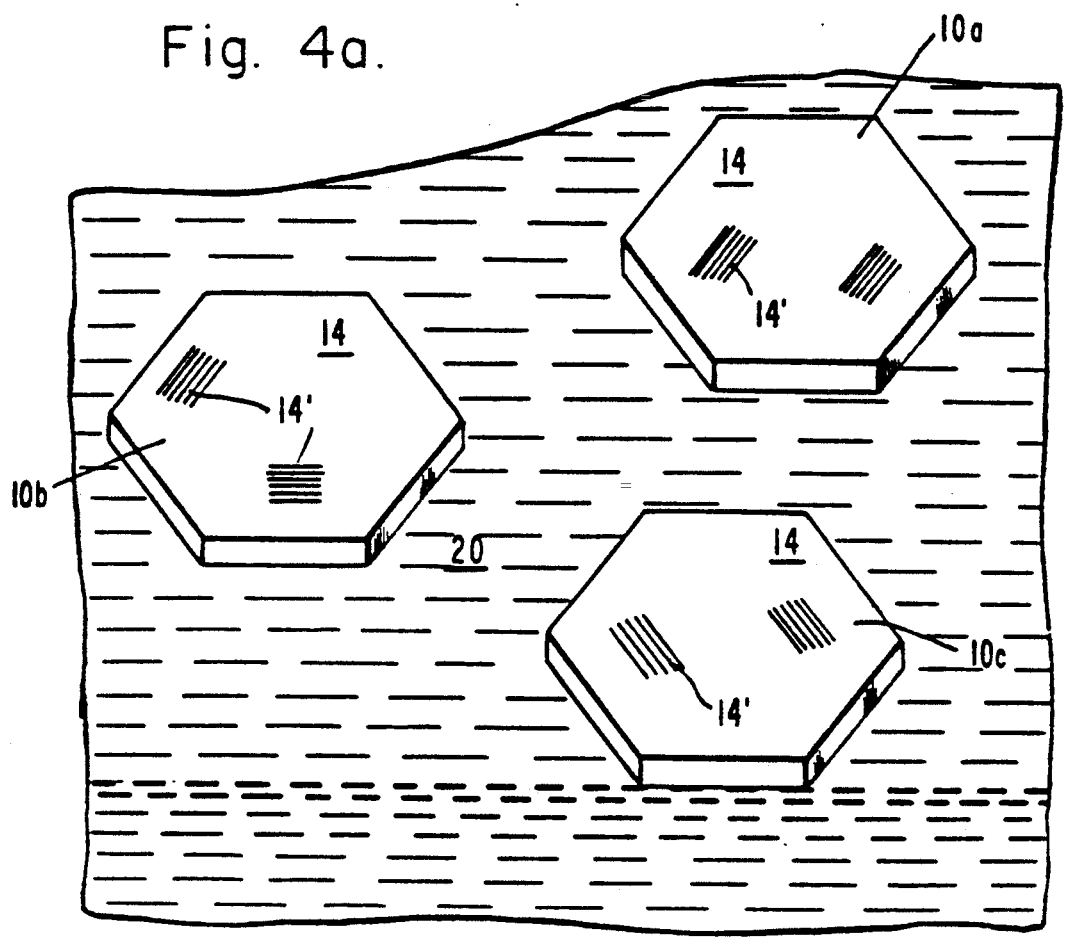
FIG. 4a shows three such segments floating in a host liquid.

FIG. 4a shows three hexagonal segments 10a-c floating in a flotation liquid 20. It is to be emphasized that the segments 10 may float due to their density being less than that of the liquid 20 or conversely may be made to float even with higher density than the liquid if the surface tension of the liquid surface is sufficiently strong and the liquid 20 does not spontaneously wet the active device surface. In an effort to reduce the surface energy of the liquid 20, a driving force will be present which pulls the segments 10 together. The total energy present in the form of the liquid surface distortions and meniscuses is thus minimized and the driving force to have the liquid climb up into the ever-decreasing intersegment gap by capillary action is satisfied. The capillary action in the gaps creates further intersegment adhesive forces. A multisegment unit 10' is thereby created spontaneously The closure rate increases with increasing surface tension and decreasing viscosity.

Figure 4B:
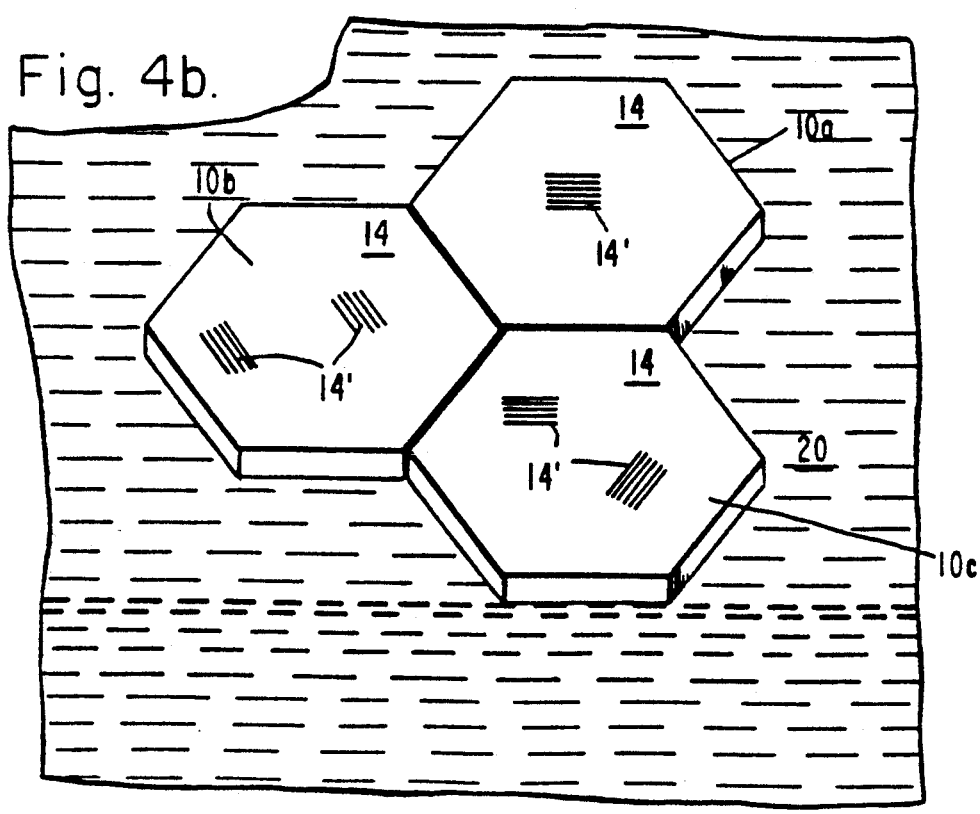
FIG. 4b shows the same three segments brought together by surface tension forces.

The equilibrium state, in the case of hexagonal segments, is not only abutted but perfectly aligned as well, as depicted in FIG. 4b. Thus, with no external mechanical means, segments can be brought together and aligned in three dimensions with submicrometer accuracy while producing virtually no particulates due to the self-controlled surface-tension forces. Assuming the liquid 20 itself is a curable polymer, then when the segments 10 are aligned and abutted as shown in FIG. 4b, one may, for example, apply heat or UV-radiation to cure and/or crosslink the polymer material 20 to form solidified microbridges 22 (shown in FIG. 6).

Figure 5:
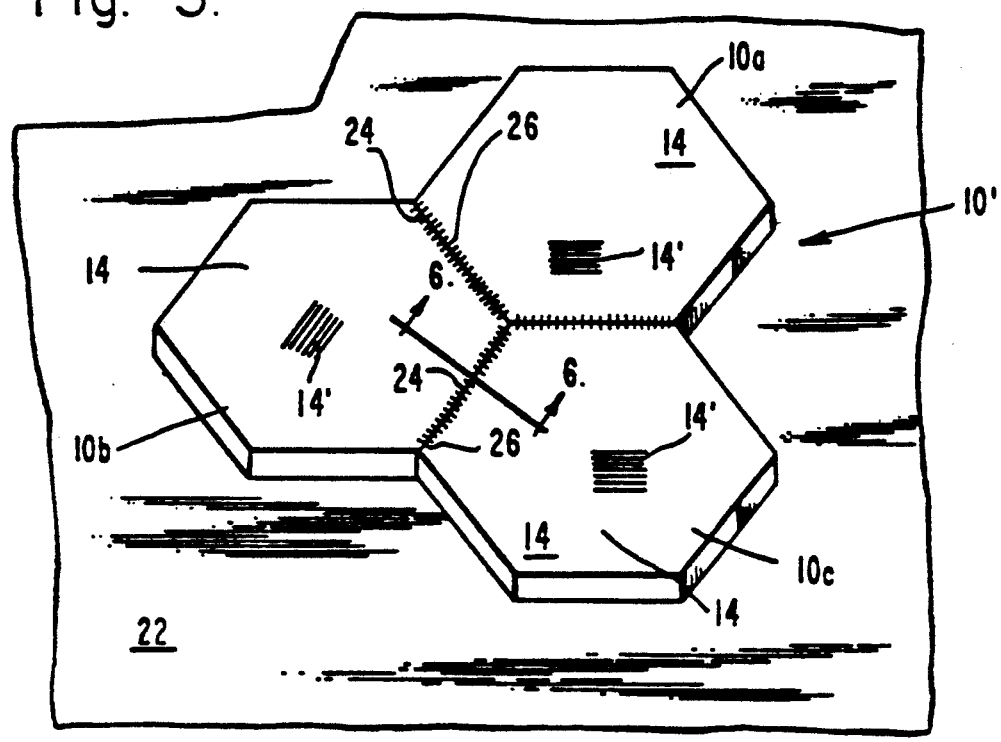
FIG. 5 shows the three segment superchip with one additional layer of interconnect which joins the circuit features on the adjacent segments, the superchip shown embedded in solidified flotation liquid.

FIG. 5 depicts the pseudomonolithic superchip 10' of FIG. 4b after curing/hardening the flotation polymer 20 to its solidified form 22 after it has drawn the segments together and filled the abutment joints with a meniscus. Two mating abutment surfaces 12a form an interface 24, which has intersegment interconnects 26 passing across it. The thin film interconnects 26 are formed by conventional means across the intersegment solidified polymeric microbridge material 22. The coplanarity of the segment topsides floating in the liquid film surface 20 insures the vertical alignment of each segment 10 to each neighboring segment. The wetting action of the liquid 20 on the segment edges 12b and 12a insures the capillary movement of liquid 20 up to the top of the intersegment gaps and also insures that the liquid 20 will not spill over or wet purposely unwettable device surface 14.

The self-limiting surface tension forces which pull the segments 10 together combined with the self-limiting movement of the flotation liquid 20 into the capillary gap formed by abutting edges 12a is considered to make the seemingly impossible task of assembling and microbridging numerous such segments not only possible but easy and volume-manufacturable with low defect density.

In FIG. 5, the flotation liquid has also served as the microbridging liquid and has been solidified in place. Conventional thin film sputtered metal deposition followed by conventional lithographic masking and etching is employed to pattern the intersegment interconnects 26. For packaging purposes, solidified liquid 22 may be removed from the assembly bottomside such that a conventional epoxy die attach can be executed.

With regard to FIG. 6, it is well-known that as circuit feature linewidths continue to shrink below 1 μm, the depth-of-focus of the optical tools employed also continues to shrink down to the few-μm level or less. Thus, it is extremely important that the solidified microgap polymer 22 of FIG. 6 has a surface bridging the gap which is contained within that depth-of-focus. If this is not the case, then attempts to print μm-sized metal lines and spaces across such gaps will result in failure due to electrical shorts caused by poor lithographic definition, in turn caused by an out-of-focus exposure. The controlled wetting of liquid 20 and the controlled planarity of all the segments using the liquid approach gives the desired result directly, i.e., that of "shallow" microbridges and coplanar microbridges. In the Biegelsen et al approach, although there is no indication given of this, the only available technique to fill the gaps would leave polymeric material also covering the segment device surfaces and thus would require an additional masking step to expose the contacts of each segment to be connected. In this invention, the interconnect metal can be deposited immediately after flotation-assembly, as no polymer goes on the device surface.

However, alternatively in the practice of this invention, once the solidified microbridges are formed, one may deposit another thin dielectric layer and cut contacts down to segments before implementing interconnects 26. The advantage herein is that with the deposition of such a film over the pre-coplanarized and closely abutted segments, one is not concerned about planarizing and filling the gaps. In yet another embodiment wherein liquid 20 is removed after it serves its alignment/abuttment function, a dielectric layer, such as plasma TEOS oxide, may be conformally deposited over the segments and gap surfaces. In this approach, that dielectric deposition itself bridges the gaps because the nominal thickness being deposited is greater than the half-width of any gap present in the structure. This process is just like the planarization of isolation trenches in silicon as used in the art for device isolation.

Figure 7:
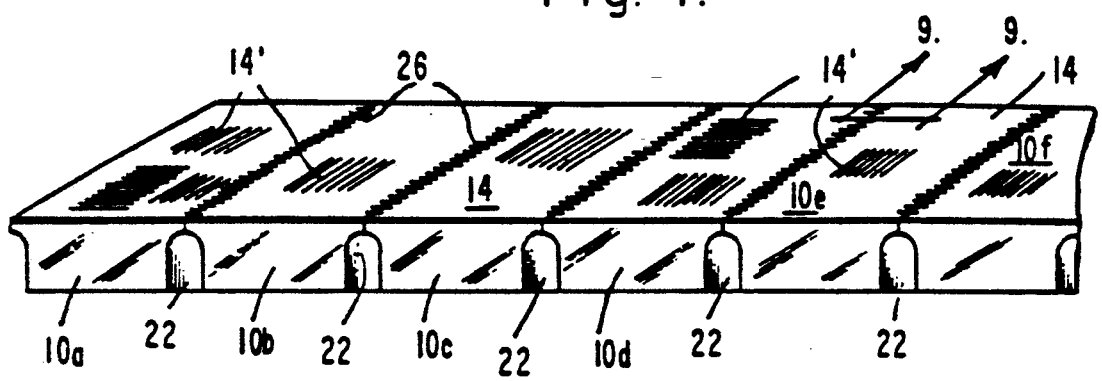
FIG. 7 is a perspective view, partly in section, of what a linear array through six approximately rectangular segments looks like after interconnection.
Figure 8:
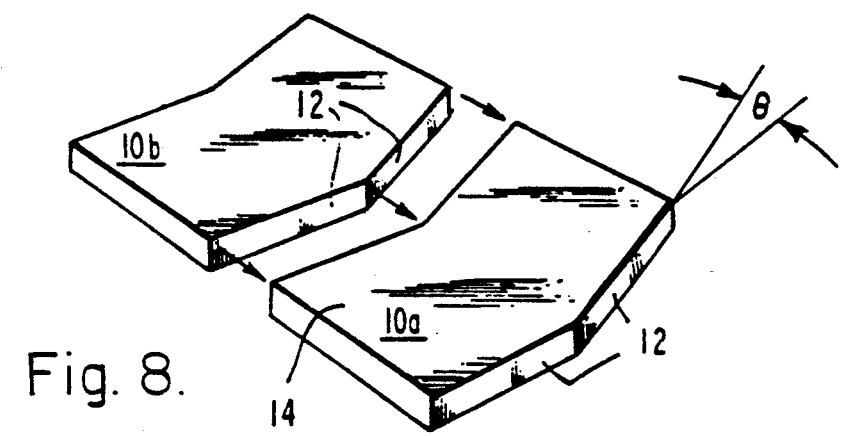
FIG. 8 shows the slightly modified shape of a rectangular segment in order to give it self-alignment action during flotation assembly.

FIG. 7 is an indication of an array employing rectangular segments. An approach to making this work is shown in FIG. 8. In FIG. 8 is shown a perspective view of a rectangular segment 10a with abutting edges 12. It will be noted that each abutting edge 12 incorporates a chevron-shaped taper. Shown is an adjacent mating segment 10b ready to be drawn in by surface tension. The important point is that $\theta$ need only be a few degrees to result in sufficient directional surface tension-induced alignment forces to correct the intersegment alignment in all three dimensions including along the long dimension of the segment. It is to be emphasized also that the minute amount of tapering may be applicable to edges 12a only or to both 12a and 12b.

Figure 6:
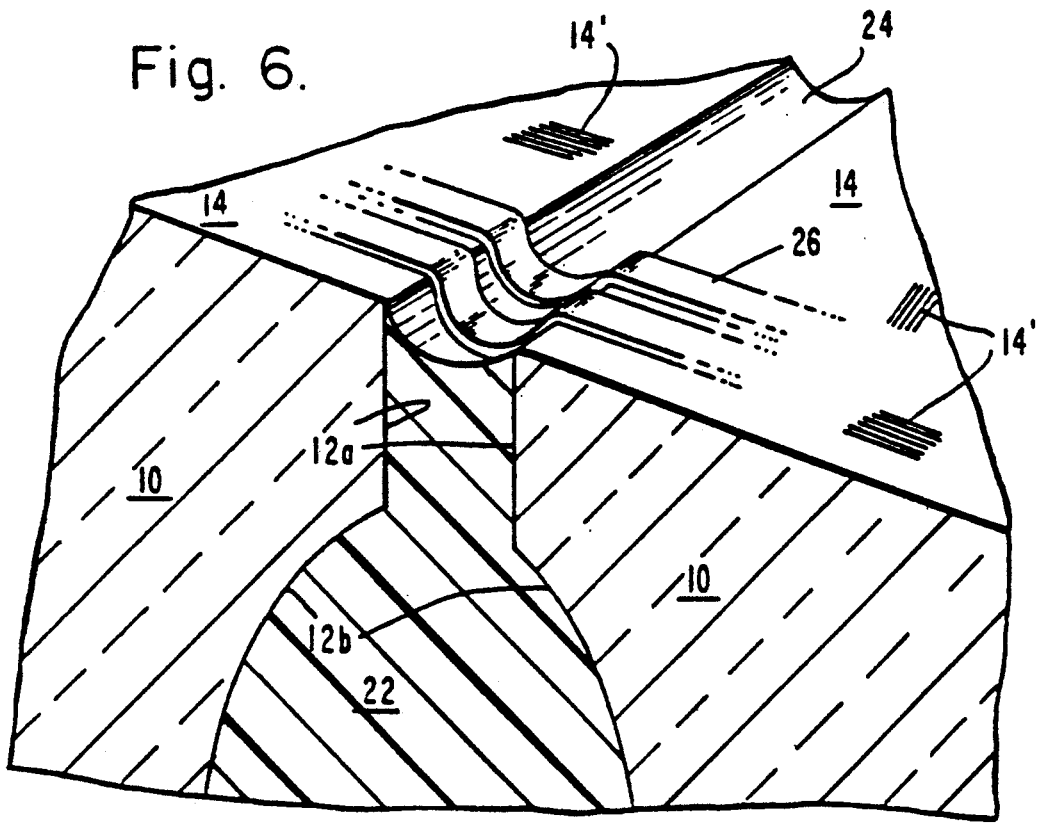
FIG. 6 is a perspective view, partly in section, taken along the line 6—6 of FIG. 5 showing what an abutting interface looks like after the intersegment interconnections are formed.
Figure 9:
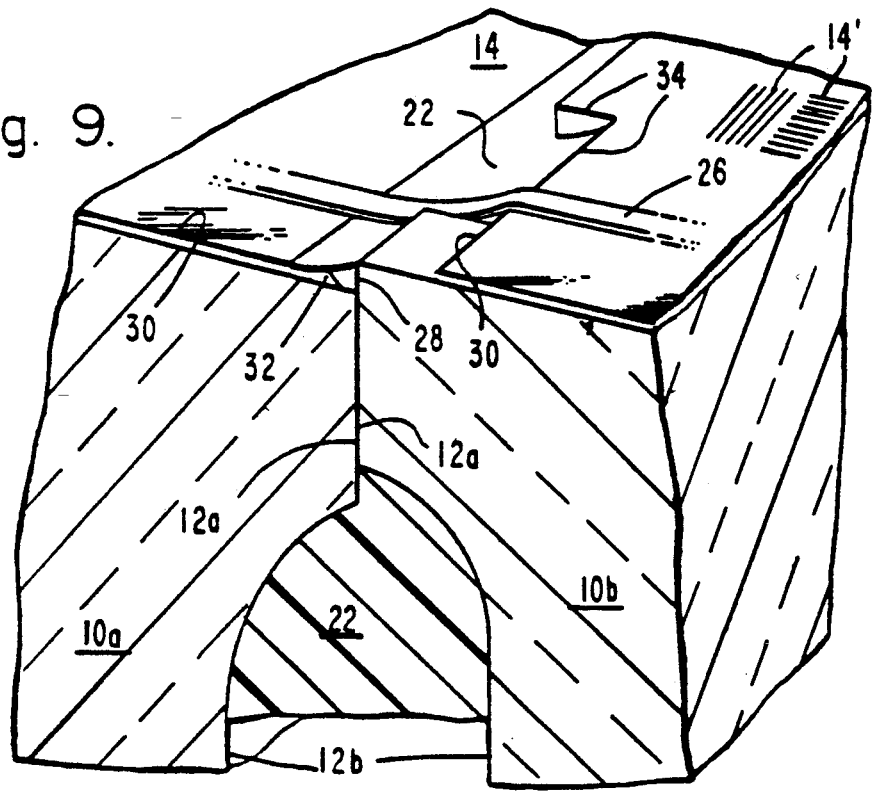
FIG. 9 depicts optional modifications to the segment surface and segment edge in order to guarantee that a polymer fillet microbridge will always be present even if the intersegment microgap is zero and there is vertical misalignment.

FIG. 9 depicts the same microgap between segments as shown in FIG. 6, but with a choice of optional modifications which guarantee that the microgap polymer microbridge will never have zero width, which could cause metal bridging and shorts during patterning and etching. For example, where the microgap is of zero width and there is a vertical offset between segments, as depicted at 28, then the flotation liquid 20 has no microgap to remain in and there will be no solidified polymer microbridge 22. Given that the segments will not be perfectly vertically aligned 100% of the time with each other, then an abrupt step can occur.

There are two solutions to this problem and they are both depicted in FIG. 9. A non-wettable film 30 keeps the flotation liquid 20 from wicking onto the device segment surfaces 14 but does permit some limited edge wetting such that a polymer fillet 32 of microjoint solidified polymer 22 is always present.

In the case of flotation liquid 20 being a polyimide, the film 30 may consist of silicon nitride or a fluoropolymer film such as thin-film Teflon. In the case of silicon nitride, only a few hundred Ångstroms are necessary, but typically, the film would simultaneously be serving as a device passivation, in which case it would be about 3,000 to 10,000 Å thick. A fluoropolymer such as Teflon need only also be a few hundred Ångstroms thick. Silicon nitride would be applied by plasma chemical vapor deposition, whereas a fluoropolymer could be deposited by plasma polymerization or sputtering.

An additional approach to the problem mentioned above involves the use of castellations or reliefs 34 formed in abutment edge 12a. These can substantially decrease the maximum potential fillet slope. The castellations could be etched by making the trench-etching operation to form surfaces 12a etch trenches with vertically grooved walls, for example. This also can insure solidified polymer fillet formation even at zero microgap dimension when the chips are perfectly coplanar. Shown situated on top of the solidified polymer fillet 32 is a typical intersegment interconnection 26.

In FIG. 9, the relief 34 also acts to permit the passage of fluid 20 through an otherwise zero-width gap such that fillet 32 can always form. The reliefs 34 may be on one or both mating segments and may be of any desired length and spacing.

DISCUSSION OF FLOTATION MECHANISM AND MEANS

The flotation liquid 20 as depicted in FIG. 4a is but one approach to employ the liquid-assisted assembly means of this invention. The four key mechanisms of the liquid with regard to the assembly action are (a) the ability of a liquid to render mating segments coplanar in preparation for assembly (joining); (b) the ability of a liquid to drive segment compaction at long and/or short distances as it seeks its minimum surface tension configuration; (c) the ability of the liquid, by virtue of its viscosity and lubricating properties, to set an upper limit on the frictional and collision forces between segments (and between segments and reference plates if one is used); and (d) the ability of the liquid to also serve as the permanent intersegment microbridges in the case of its having the ability to solidify into a useful microbridging material after its self-limiting capillary filling of any remaining microgap is complete.

An additional ability of the liquid to act to mechanically suspend segments above the surface (or below a surface) of a wetted reference plate in order to render them mobile as shown in FIG. 11 is also useful, but independent of the other four aspects which are always available, even without a reference plate.

Not all of the features need be exercised in a given application; therefore, examples of this will now be given with reference to additional Figures.

EXAMPLE 1

In this Example, a first liquid is used to draw segments together over macroscopic distances and a second liquid independently forms solidified microbridges.

In FIG. 10a, two segments 10a, 10b with abutting edges 12 are shown with their active device surfaces face down on an auxiliary flat reference surface 36. The liquid 20 is introduced which promptly wets the wettable abutment faces 12. The liquid will draw the segments together as shown by the arrows in FIG. 10a, especially if either the segment surfaces other than edges 12 are not wettable (as shown in the drawing) or if both edges 12 and segment backside surfaces (opposite device surface 14 and face-up in FIG. 10a) are wettable (not shown) and liquid 20 is gradually evaporated or removed such that the last place it remains before completely disappearing is solely in the microgaps due to its tendency to move there under the influence of capillary pressure. As depicted in FIG. 10, the segment top and bottom surfaces are not wettable and the reference surface 36' is also not wettable. The liquid 20 may be introduced by virtually any means including immersion, drip dispense, spray, ultrasonic spray, syringe dispense, or condensation. The liquid may already be disposed on the segments or on the plate or on both even before the segments are placed on the plate. The liquid may also be provided by melting a previously solid material previously disposed on the segments, plate, or both segments and plate. The liquid may also be introduced through holes or pores in the reference plate.

As the liquid moves to fill the intersegment gaps by capillary action, it draws the segments together. The motion of the segments may be made easier by providing ultrasonic agitation, by making surface 36' very slippery, such as with a polytetrafluoroethylene or nylon coating or by having surface 36' be tilted or having air or inert gas ejected from a perforated surface as indicated by Biegelsen et al in their FIG. 3 (a common air table known in the art). Liquid 20 may be arranged to completely evaporate in the case where it is not employed as the permanent microbridge material and after alignment/abutment is complete. In such a case, a second liquid would be introduced in a fashion such as suggested for the first liquid which would also wick into the interfaces (now that the segments are abutted) and that second liquid would be solidified in place. The drawing-together action is due to the initial co-wetting of the two segments 10a, 10b shown in FIG. 10a allowing for flow of the liquid to the extremities as it minimizes its presence in the intersegment regions by narrowing their dimension in an attempt to minimize the total surface energy and satisfy capillary forces. In FIGS. 10a and 10b in this two-liquid approach, the first liquid (the joining action liquid) may wet substrate 36, but the final curing liquid (the second liquid) would not wet the substrate unless its cured adhesion strength to the substrate is minimal. If this were not the case, the reference plate could not be removed.

EXAMPLE 2

In this Example, liquid is not used to draw segments together over macroscopic distances, but does suspend segments face up. The same liquid forms microbridges upon the segments achieving close proximity as aided by external means.

In FIG. 11a, two segments 10a, 10b with abutting edges 12 are shown with their active device segment surfaces face-up sitting on a set-up surface 38. On the active device topside surfaces 14 is shown three bodies of wetted fluid 20 wetted to three topside wettable areas 40. The edges 12 also retain wetted fluid 20. With the abutting edges prewetted, when the opposed edge bead meniscuses touch each other, surface tension will tend to pull them laterally together.

In FIG. 11b, a superflat substrate 36 similar to that of FIG. 10 is shown. However, in this case, disposed on the underside of substrate 36 are additional wettable areas 40 which also are wetted by liquid 20. The substrate 36 is brought into contact from above with likewise wetted segments 10, causing the substrate 36 and segments 10 to be mutually joined via the co-wetting of juxtaposed wettable areas 40 Thus, the segments 10 are physically suspended and may indeed undergo externally induced lateral motion Given the mutually opposed wettable grids of wettable areas 40, there will always be a capillary suction force because during motion as old capillary wetting bonds are broken, new ones are formed. The segments 10 may be moved together in this case by air jets, by tilting or other mechanical means. Once the liquid 20 sitting on opposed edges 12 touches, then the two segments will be intimately drawn together, as shown in FIG. 11c. Alternatively, if the opposed wettable pattern or grid 40 does not have the same pad pitch, then the individual interpad meniscii will be distorted and the segment will have a tendency to move in a direction to minimize the average distortion. Thus, selection of an appropriate pattern can cause movement of the individual segments to abut, without the use of external forces.

In FIG. 11c, the microbridging liquid could be cured from below selectively using UV radiation crosslinking. In FIG. 11, there is no drawing-together action until the segments, wetted edges 12 contact each other. If the microbridging material 22 is selectively cured, then substrate 36 can be removed, so long as means are provided to attach this multisegment unit 10' to a substrate It should be noted that the arrangement of FIGS. 11b and 11c may be flipped upside-down such that the segments are face down on the flat substrate 36, similar to the approach of FIG. 10; that is, this approach can work either way.

In the foregoing scheme, the agent liquid's drawing power is only employed over short distances on the order of a meniscus diameter. In FIG. 1, the liquid 20 does all the work, even at long range. In FIGS. 11a–c, the quantity of liquid used is far less and the chip backside can be kept clean as a result. The chip backside can also be kept clean in the FIG. 10a/10b approach.

EXAMPLE 3

In this Example, liquid is used to draw floated segments together over macroscopic distances, but coplanarity is enhanced by external means.

In FIG. 12 is shown yet another variation on the basic technology. Here, a pool of liquid 20 has two segments 10a, 10b which have already been drawn together as shown in FIG. 12a by surface tension forces (as also shown in FIG. 4b) A difference here is that a superflat nonwettable substrate 36 is brought down from above such that the co-wetted floating segments are forced to be perfectly coplanar if they are not already (FIG. 12b).

It will be noted in the exploded view of FIG. 12a, that the wetting flotation liquid 20 forms a meniscus which slopes upward to the chip surface 14 which is actually slightly above the liquid surface in the case wherein the liquid density is greater than that of the segments and the segment edges are wettable. This distance d of FIG. 12a' is a function of the balancing of surface tension forces and buoyancy forces. d may actually be negative such that the meniscus curves downward to the segment edge if the segment is denser than the liquid In the case of FIG. 12b, these distances for each and every segment are reduced to zero by lowering substrate 36 Substrate 36 may be designed itself to float. The microbridging liquid 20 in the intersegment gaps would be solidified (cured) while substrate 36 maintains perfect coplanarity. In the case of d being negative, the substrate 36 may be designed to allow the pulling of a vacuum by pumping gas through its thickness. Thus, the air pockets defined by the segment areas having negative d can be evacuated and the configuration of FIG. 12b obtained.

There are numerous approaches similar in nature to that of FIGS. 12a and 12b, with or without the use of "enhancement" substrates. Another would be the case wherein instead of substrate 36, one would introduce a second liquid 20' which forms a liquid-liquid interface with liquid 20 but which does not appreciably mix with liquid 20. Thus, the segments 10 actually float in a liquid-liquid interface. The orientation of the segments could now be face down as shown in FIG. 13. In FIG. 13 is shown two segments 10a, 10b floating on liquid mercury 20' on top of which a UV-curable, liquid polymer material 20 also floats. The extremely high density and surface tension of liquid mercury 20' gives a result equivalent to that of FIG. 12b using rigid substrate 36.

Common themes of these examples and the multiple variations possible on just these examples are as follows:

Precision abutting edges 12a are formed on at least part of the mating segment edges 12.

An agent liquid is used at least in one of the following ways:

1) to form liquid microbridges when oppositely facing wetted segment edges 12a co-wet each other on meniscus contact, the microbridging action as driven by surface tension forces achieving final segment alignment and possibly also serving as a final structural microbridge in a solidified state;

2) to draw together by surface tension forces multiple segments over macroscopic distances in a coplanar manner when those segments are floating on or in a liquid-gas or liquid-liquid interface or are sitting on a reference surface. (When contact is made, the final alignment is achieved by the liquid microbridging action, i.e., the liquid is drawn into and upwards into any remaining wettable gap);

3) to control the assembly action forces acting on the segments via surface tension and viscosity selection to minimize mechanical damage. An extreme example of using only the mechanical-damping and lubrication properties of the fluid but not necessarily any of its microbridging/alignment abilities would be basically the Biegelsen et al approach, with the key modifications being that the segment edges are all wetted, <100> material can be used, and segments are fabricated as described herein.

4) to lubricate the segment edges such that intersegment friction is reduced;

5) to damp external mechanical vibration to minimize mechanical intersegment damage as exercised, for example, in schemes which fully float the segments;

6) to provide a means of handling ultrafragile parts without external mechanical manipulation in order to minimize particles and damage;

7) to create an ultraclean and reproducible environment for segment assembly in that a fluid has two highly advantageous properties;

a) it can be circulated through an ultrafilter or distilled, and b) its properties are highly reproducible and the cost can be low; and 8) once assembled into arrays of segments, the resulting superchip is much more tolerant of packaging-induced stresses than its monolithic counterpart, due to the flexural elasticity allowed by the solidified microgap material.

A further benefit of the liquid 20 forming microbridges 22 between segments 10 and curing in place is as follows. Reference is made to FIG. 14.

It will be noted that one of the segments 10 has a gouge or chip 42 in its edge 12a but that microbridging liquid 20 has filled it in and provided gently sloping contours such that fine interconnects 26 (not shown) could be fabricated passing across the defect 42. Precision abutting edges 12a are indicated.

Figure 14A:
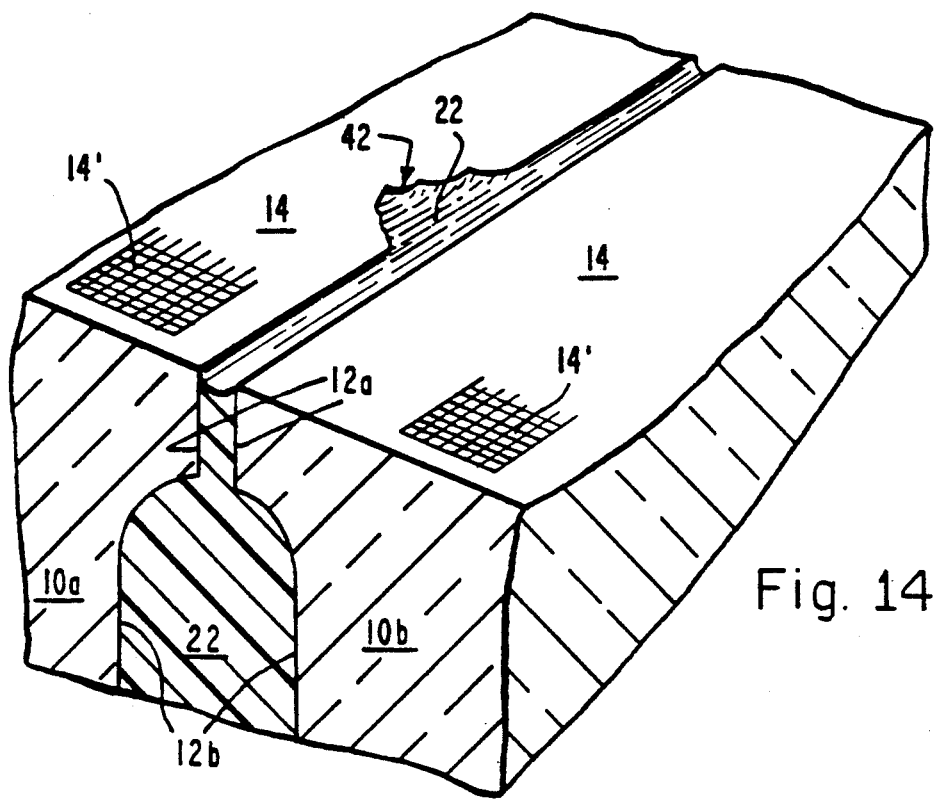
FIG. 14a is a perspective view showing how segment edge-damage can be healed by a cured-in-place liquid.

Liquid 20 which is solidified to form microbridges will be referred to as item 22, which will consist of the microbridge material across the gap as well as any other solidified liquid 22 such as is shown in FIG. 14a filling the space between edges 12a as well as edges 12b.

Figure 14B:
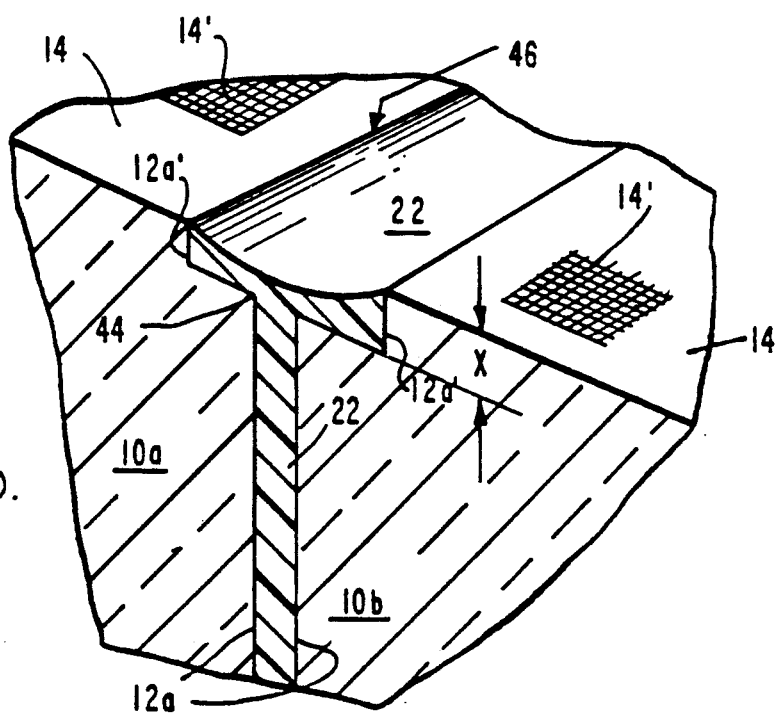
FIG. 14b is a perspective view showing how the abutment edges can be independent of the edges wetted by the liquid.

FIG. 14b shows yet another segment edge arrangement. Rather than having a crudely defined portion 12b, each segment edge consists of a precisely cut face 12a and a set-back lip 12a'. Surface 12a could be cut using a precision wafer-saw with multiple passes to smoothen surface 12a and to minimize chipping on corner/edge 44. Any of the other previously described dry-etching or excimer-laser etching processes could also be employed for surface 12a. The recessed or set-back nature of lip 12a' insures that corner/edge 46, which would be fabricated with a very sharp and precise definition, will not be damaged by handling and/or abutment or, most significantly, by a wafer-saw operation used form surface 12a. An advantage of this approach is a guaranteed smooth and defect-free interface edge 46 between the segment surface and the solidified bridging polymer 22 surface. Both edges 12a and 12a' may exist along the entire segment edge (as shown) or, (not shown) 12a' may be of limited size similar to the relief 34 in the previous FIG. 9.

FLOTATION LIQUID AND MICROBRIDGE MATERIALS CONSIDERATIONS

The chief attributes of the flotation liquid 20 are that it has enough surface tension to pull the segments together while also possessing low enough viscosity such that the segments may move reasonably quickly under the influence of that surface tension. The density should be such that the difference between the weight of the segment and the bouyant force on the segment does not cause (a) the segment to float high in the liquid such that the coplanarity of different segment thicknesses is lost or (b) the segment wants to sink and the surface tension is insufficient to keep it afloat.

The foregoing situation describes the case of full flotation. In the case of not using full flotation, FIG. 10, for example, then one must either insure that the liquid 20 does not wet the support plate's surface 36', or if it does, then the liquid density has to be lower than the segment density or the segments will float off the support plate 36 and lose coplanarity.

Experiments have been carried out using ordinary deionized (DI) water as a flotation liquid in approaches depicted in FIGS. 4a, 4b and 10a, 10b. In the free-floating scheme of FIGS. 4a, 4b, the water container was ⅛ inch deep and 6 inches in diameter. Several generally rectangular silicon die segments having a silicon nitride top-side dielectric and measuring approximately 0.100 inch × 0.125 inch × 0.015 inch thick each were free-floated by carefully placing them on the water surface with tweezers. The same segments were floated off the bottom of a wettable ceramic container to the fully floated condition by dispensing water on the dry container bottom with a syringe, being careful not to splash droplets on the difficult-to-wet segment top-sides. The floated segments aligned and abutted within 10 seconds when their initial separation was less than ⅛ inch.

For the approach depicted in FIGS. 10a, 10b, a reference plate of smooth Teflon was used which the water 20 did not wet. The water 20, when dispensed in the vicinity of two closely-spaced segments having water-wettable edges, caused the segments to pull together instantly into intimate contact if the initial gap was less than about 0.015 inch, with the water then being evaporated.

Water, having a density of 1 g/cm$^3$, is much less dense than silicon at about 2.3 g/cm$^3$; thus, the considerable surface tension forces required to float the segments in the scheme depicted in FIGS. 4a, 4b anyway is graphically seen. In the above FIG. 10a/10b approach (Example 1), the chip segment edges were slightly oxidized (wettable), whereas the segment bottomsides were gold-coated (non-wettable).

The requirements for the solidified microbridging material 22 are far more stringent than that of a liquid 20 only serving the flotation and alignment functions, as it must posses semiconductor electronic-grade ionic and particulate cleanliness and must also be selected from the materials known to serve as acceptable dielectrics in microelectronic chips and hybrids. This is a far narrower list. This material 22 may be different than the flotation liquid 20 (a second liquid) or may be the same material 20 solidified or cured in place to form the microbridge material. The solidified microbridging material may be deliberately selected to be compliant, for stress relief.

A list of examples of the materials which may serve the functions of materials 20 and/or 22 is now given. This is but a small sampling of the many possible materials. It is to be noted that there are two ways of describing viscosity in the cgs measurement system. The first is called absolute viscosity and has units of (gm/sec-cm) or "poise". The second is similar to the first, except it is called kinematic viscosity and is simply the ratio of absolute viscosity to density, or (poise/density) or (gm/sec-cm-density) or "Stokes". These terms are used herein as either most often used in the literature or by the vendors of the material in question.

Flotation liquids:

(1) water (FIGS. 4a, 4b, 10a, 10b scheme)
(2) methyl or iso-propyl alcohol (FIGS. 10a, 10b scheme using Teflon surface and initial segment spacing less than the segment thickness)
(3) N-methyl-2-pyrrolidone (FIGS. 4a, 4b, 10a, 10b scheme using Teflon surface-1.65 cp viscosity, 1.03 g/cm$^3$ density)
(4) a dual liquid system comprising a thin-film of liquid "A" on a body of liquid "B", e.g., any long-chain alcohol on water, which permits modification of surface tension independent of bulk viscosity (FIGS. 4a, 4b scheme)
(5) molten indium or other low melting point metals or alloys where the flotation times are kept short and the wettability condition is just like that needed to form a good solder joint. In this approach, it has to be acceptable to electrically short the segment edges of bulk material.

Additional examples of suitable flotation liquids include polyimides or polyimide precursors, solutions of silica, molten paraffin, and UV- and heat-curable polymers.

Microbridging solidification liquid materials:

(1) fully imidized polyimides thinned to low viscosity, such as Ciba-Geigy Probimide 285 thinned with 4-butyrolactone to below 50 centistokes or Ciba-Geigy Probimide 286 thinned with xylene and/or 4-butyrolactone to below 50 centistokes;

(2) liquid potting resins for the hybrid industry (one component epoxy), such as Hitachi HIT-8000 Resin, with ethylene glycol monoethyl ether as the solvent (conventional viscosity is 350 cp);

(3) Polyimide precursors such as the following Hitachi materials:
   (a) $\approx 1.15$ g/cm$^3$ PIQ 6000 series at $\approx 1$ poise viscosity,
   (b) $\approx 1.05$ g/cm$^3$ PIQ 13 at 11 poise viscosity, These may be thinned further with N-methyl-2-pyrrolidone. It will be noted that the 6000 family has $\approx 40\%$ solids content; 13 family has $\approx 15\%$ solids content;

(4) High purity silica solutions for use in a nitrogen ambient such as the following Hitachi materials:
   (a) $\approx 0.85$ g/cm$^3$ HSG-2000@viscosity=2.3 cp,
   (b) $\approx 0.90$ g/cm$^3$ HSG-2200@viscosity=7.5 cp;

(5) high purity liquid-epoxy compounds such as Hitachi KE 6000;

(6) molten indium or other low melting-point metal or metal alloy, with the same limitations as for use as a flotation liquid.

Additional examples of suitable microbridge materials include UV- and heat-curable polymers.

As noted in the list above, some materials, such as Hitachi Polyimide PIQ-13, can be thinned, in this case using N-methyl-2-pyrrolidone from the conventional 1100 centipoise (14.5% solid content) down to the 4 to 6% solids range with an accompanying one to two orders of magnitude of viscosity reduction.

Further, one may use the melting/freezing phenomenon of an alignment liquid to advantage. Examples of such materials include water/ice, molten paraffin/solid paraffin, and molten low-melting point metal such as indium (which has a melting point of 157° C.). Such solidified materials may, as in the case of indium, serve as a permanent microbridge or in the case of paraffin hold the segments in abutment so that they can be attached to a permanent substrate and then microbridged with a second new material.

The interface gap between segments acts much like a capillary in that as long as the liquid wets the walls of the capillary, it will seek to be sucked up into the gap, following the well-known Laplace relation $$\Delta P = \gamma(1/R_1 + 1/R_2) = \Delta \xi g h$$

where the pressure drop $\Delta P$ across the meniscus is proportional to the liquid surface tension $\gamma$ and is inversely proportional to the two orthogonal principal radii (R) of the meniscus. $\xi$ is the liquid density, g is gravity, and h is the capillary height.

For intersegment gaps of a few micrometers, this $\Delta P$ is very large and thus any of the disclosed materials 20, 22 will climb up to the top of the intersegment gap by capillary suction. A liquid will always seek to move into the narrowest wettable gaps under the influence of capillary pressure at the expense of leaving regions where the meniscus radius is larger.

The fact that the flotation liquid climbs up the gaps by capillary action creates an intersegment attractive force (which drives alignment/abutment to completion). This force F is given as $$F = \gamma_L V/X^2$$

where X is the gap width, V is the volume of liquid in the gap, and $\gamma_L$ is the liquid surface tension.

As can be seen, at small gaps X, the force gets extremely large, insuring alignment and mechanical stability. At large separation distances, the attractive forces are created by a net reduction in surface distortion energy of the liquid surface. The capillary forces are much larger.

The use of foams and emulsions to serve the purposes of either flotation/alignment (most likely as in FIGS. 10a, 10b) or microbridging (as in any of the Figures) is entirely within the scope of this invention. It is well-known that a foam eventually drains itself into nonexistence and in so doing would provide the alignment/flotation liquid to the microgaps without ever having to employ a bulk liquid.

COMMENTS REGARDING SEGMENT SIZES AND SUBSTRATES TO WHICH SEGMENTS CAN BE MATED

There is no lower limit on a segment's size, not in lateral or thickness dimension. This is a significant engineering advantage, because in designing a multisegment chip, one intrinsically would like to have the ability to vary the process technology from segment to segment on a fine scale. Ultrasmall segments, on the order of a few hundred micrometers in edge length or smaller, allow one to take advantage of each process-technology's advantages (while avoiding its disadvantages) on any desired scale.

As an example, consider the use of implanted oxygen to form insulating buried layers. This is a technique known to the art for application to high performance substrates. It results in a buried SiO$_2$ layer a few micrometers deep under the silicon surface. That few micrometers of silicon will be the segment thickness. Dry plasma etching of trenches in silicon down to the oxide layer will define the segment edges 12. By employing an isotropic oxide etchant such as liquid or vapor HF or CF$_4$/O$_2$ plasma, it is possible to mechanically detach such segments by etching away the underlying oxide. These segments then are just sitting on the surface and can be floated off or picked off the wafer. In the case of an isolated segment (shown in FIG. 15), a liquid can be used to lift the segment out if the liquid wicks into the etched slots and interface defined by surfaces 54 and trenches 56 without wetting the segment device surface.

Figure 15:
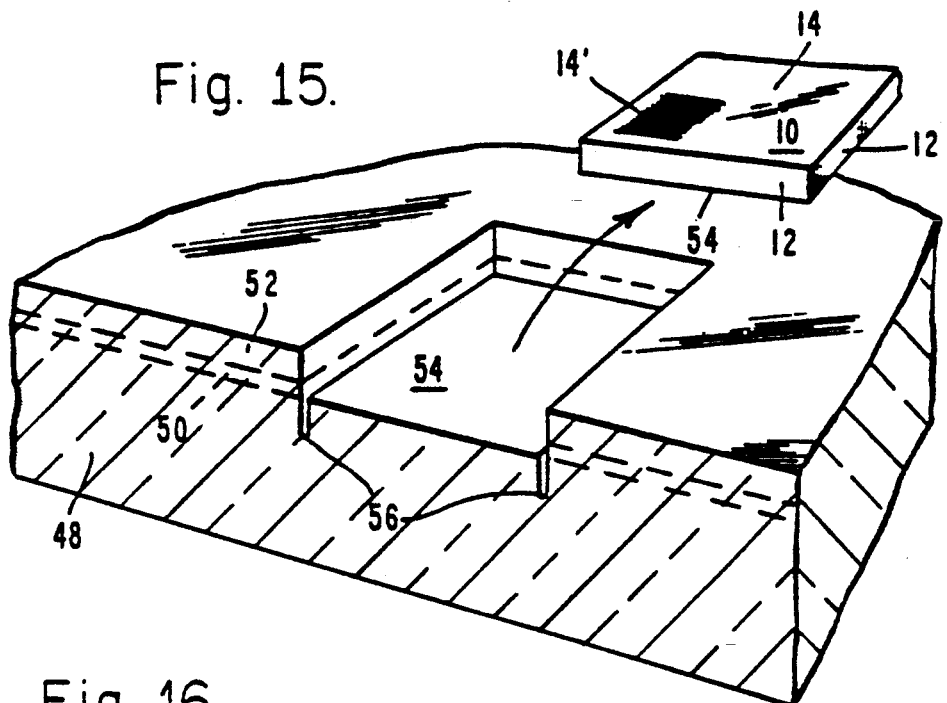
FIG. 15 is a perspective view showing a method of making ultrasmall segments or ultrathin segments.

Thus, segments as small as a few micrometers in edge length and fractions of a micrometer in thickness can easily be made. The mindset of having to manually manipulate the segments is unnecessary. FIG. 15 depicts this particular ultrasmall segment capability.

Shown in FIG. 15 is a silicon wafer 48 having a buried oxide isolation layer 50 on top of which are formed in device region 52 at least one segment 10. One such segment 10 is shown lifted or floated out of its position in wafer 48, leaving behind a hole and creating new surfaces 54 formerly forming the upper and lower bounds of oxide 50. Dry plasma or reactive-ion etched or excimer laser-etched separation trenches 56 are shown. It is to be noted that segment 10 has edges 12 which consist of only a vertical precise edge 12a.

It is of great technological significance that extremely thin segments can be made for three reasons. The first is that such segments can easily accommodate contact through-holes and thus could be stacked in three dimensions.

The second reason is that thin sections, especially laterally large thin sections, will flex under the influence of wetting capillary forces. This can be used to advantage. Specifically, as segments get laterally large yet very thin, they will naturally be non-flat due to the bending forces of the stressed thin films making up their circuitry. If it were not for the fact that the flotation liquid selectively wets such segments and pulls them to a flattened shape, there would be no conceivable way to deal with potato-chip shaped ultrafragile segments.

The third reason is that such thin sections have very short thermal paths to their mating substrate means and are flexurally forgiving. Thus, not only can they be mounted on flexurally non-rigid substrates such as flexible circuits, but the superchips assembled from them will not have the cracking problems associated with today's large chips.

To further expand the applicability of the present invention to superchips, consider the hole in the surface of wafer 48 of FIG. 15, rather than the segment 10 formerly filling that hole. If that hole is made deep enough, then it can serve as a receptacle for one or more stacked microthin segments. In such a case, the walls of the hole, or receptacle, appear to the floating segment 10 to be just another segment to which attractive wetting can occur.

Figure 16:
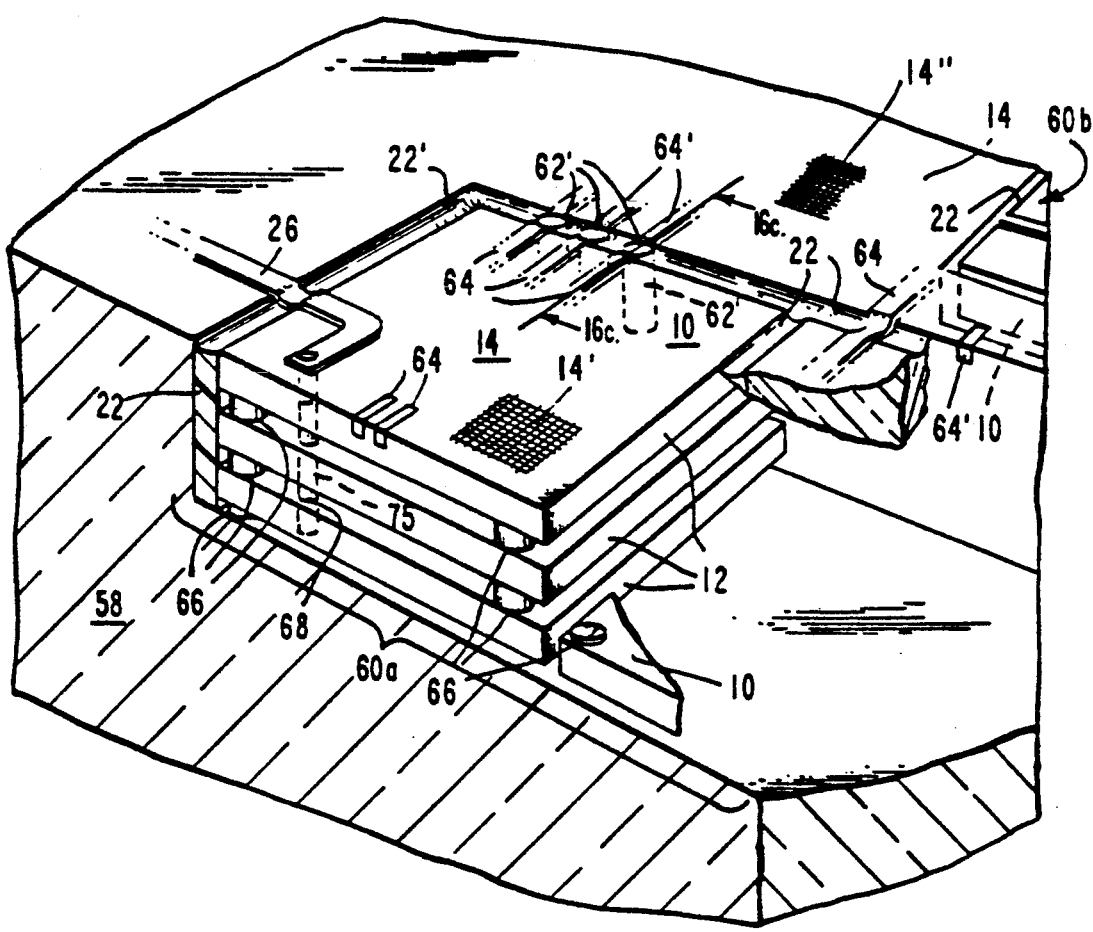
FIG. 16 is a perspective view showing (a) a mother substrate having at least one receptacle into which a segment can be mated using the liquid means and then microbridged in accordance with the invention, and (b) an optional ability to employ two or three dimensional selective tungsten electrical and thermal contacts.

A scheme employing such a receptacle approach in a mother substrate while also employing the floated assembly/microbridging means while also optionally employing selective tungsten three dimensional interconnects is now shown in FIG. 16. It will be noted that in the case of a receptacle approach with one or more segments aligned into a single corner and arranged in a single row, the receptacle and the segments can have 90° right-angle edges, since there is no need to deal with the previously cited problems of compacting an array of segments in a plane having edges defined by straight lines passing all the way across the array.

In FIG. 16 is shown a section of a mother substrate 58 in whose surface are show two receptacle regions 60a, 60b. In receptacle 60a is shown a stack of three segments 10, each of which is joined to the substrate 58 by solidified polymer 22. Also shown in receptacle 60a is a partial stack, comprising a part of a bottom segment and a part of a top segment (the middle segment having been omitted for clarity). Passing across the top of the triple segment stack of the substrate 58 is an interconnect 26. This passes across the solidified microbridge material 22 as depicted in many of the earlier Figures (e.g., FIGS. 6 and 9). A difference, however, in FIG. 16 is that there may be stacks of segments present and segments may be connected to a substrate and/or to other segments in receptacles in substrate 58. No existing hybrid technology could hope to form self-aligning segment-to-substrate contacts on a pitch (linear density) equivalent to that on a chip in volume manufacturing at low cost and low defect density. Shown on the surface of mother substrate 58 is some built-in integrated circuitry 14″ similar in nature to that of 14′ shown on the segments 10 themselves. Obviously, the mother substrate 58 may consist of a semiconductor wafer incorporating both segments 10 and its own native selection of devices/circuitry 14″. Applications wherein the substrate 48 of FIG. 15 is the same substrate as 58 of FIG. 16 are within the scope of the invention. In such an approach, unyielding segments of 48 would simply be replaced with yielding ones from another wafer.

It should be emphasized that the structure of FIG. 16 permits three-dimensional superchips of huge size wherein the circuit feature-sizes can be at their lower producible limit throughout. There is no discontinuity of feature scale anywhere This is not a hybrid by any of the present definitions. There is no interconnect wirebonding or soldering, glass-to-metal sealing or ceramic-to-glass sealing, and all of the described operations would be carried out in a wafer-fabrication environment using wafer-fab tools.

Additional features shown in FIG. 16 include deep via holes 62 in the solidified polymer 22 cut through the full three segment depth of the multisegment stack. These holes 62 align with segment edge contacts 64 and also with substrate 58 edge contacts 64′. Such a feature is further depicted in FIG. 16c, which is an enlargement of a portion of FIG. 16. The holes 62 are lined or backfilled with chemically vapor deposited metal 62′ such as selective tungsten, etch-back blanket tungsten, or chemically-vapor deposited aluminum, thereby completing electrical connections in both the vertical as well as horizontal (across the microgap) directions.

Figure 16A:
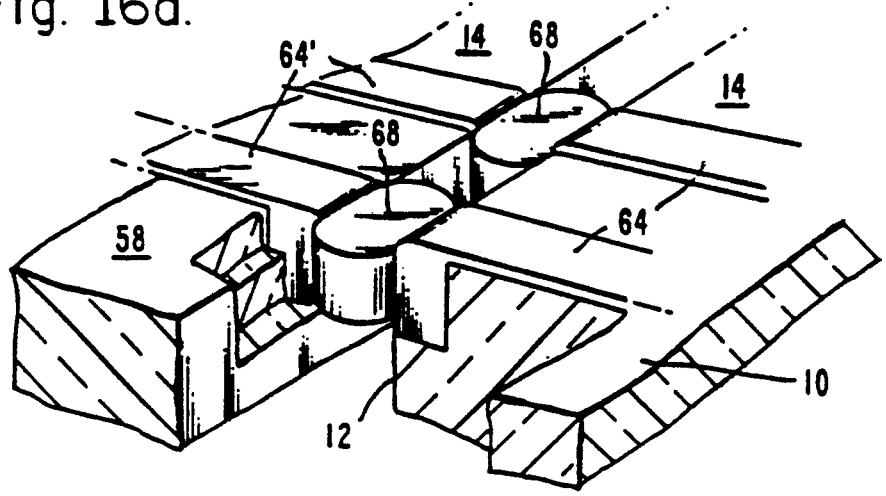
FIG. 16a is an enlargement of a portion of FIG. 16, depicting a portion of a selective tungsten connection between a segment and a superchip.
Figure 16B:
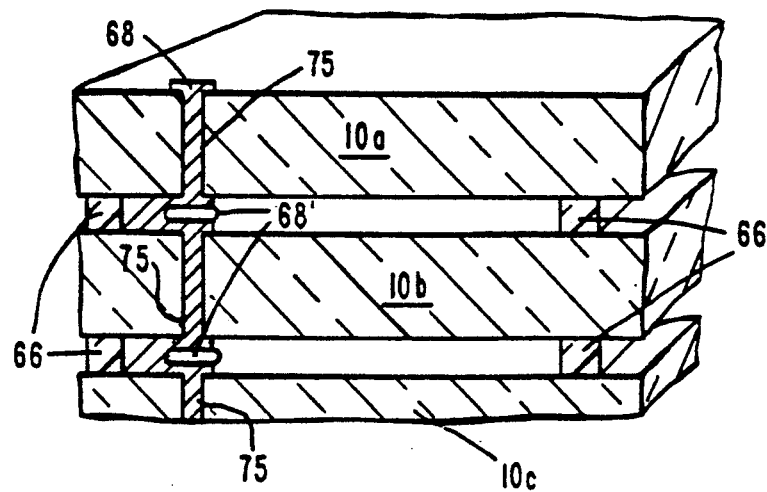
FIG. 16b is a side elevational view of an interconnect between a plurality of stacked segments.
Figure 16C:
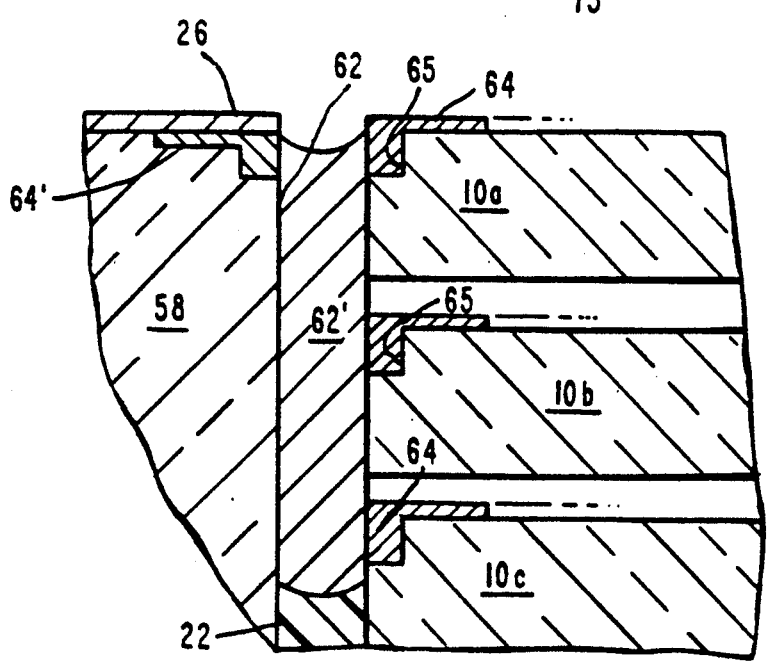
FIG. 16c is a cross-sectional view, shown enlarged, of a portion of FIG. 16, taken along the line 16c—16c, illustrating a selective tungsten connection between a superchip and a plurality of vertically stacked segments.

FIG. 16c depicts a cross-sectional view of metal filling a hole 62 formed in the solidified microbridge 22. One or more edge contacts 64 on the surface of the segments 10 are interconnected with an interconnect on the superchip 58. Here, CVD tungsten (or other metal, such as aluminum) is blanket-deposited everywhere on the superchip and top surface of the top-most segment 10a and in the opening 62 formed in the solidified microbridge 22. The blanket-deposited metal may be etched back without a mask, leaving it only in the deep via 62 of FIG. 16c (as shown) or etched back with a mask such that it can also serve to simultaneously make surface interconnects 26 (shown made separately in FIG. 16c).

Edge contacts 64 and 64′ are made by forming a trench 65 in the vicinity of the edge of the segment or superchip, respectively, which terminates at the edge. The trench is filled with metal, which is extended along the surface to form interconnects to circuitry features, much like interconnect 26. Prior to filling with metal, the trench is processed so that the metal is electrically isolated from the substrate. Examples of such electrical isolation include forming an oxide film lining the trench or. forming a junction in the trench. Such electrical isolation methods are known in the art and form no part of this invention.

Shown separating the stacked segments in FIGS. 16 and 16b are spacers 66 which might be of photo-definable polyimide. Also shown in FIGS. 16a and 16b are selective tungsten chemically vapor deposited (CVD) connections 68 of two types. Through-segment selective tungsten connections 68 become practical in the case of very thin segments through which vias may be easily etched. One such through-connection is also seen in FIG. 16, on top of which terminates a surface interconnect 26. Metal buttons 68′ may be used to connect the through-segment connections 68, employing selective tungsten.

In this manner, pass-through contacts dropping through multiple segments may also be used. In FIG. 16a is shown how selective tungsten contacts 68 may be employed to bridge the gap between a segment 10 and a substrate 58 in a single level of surface interconnect.

In any application of intersegment, segment/substrate or through-segment contacts 68, there would necessarily be sufficient pathways or passages for the gaseous CVD reactants to transport to/from the sites 68. This could be arranged, for instance, by the non-wetting of fluid polymer 20 of the surfaces on which contacts 68 reside. FIG. 16b depicts a side elevational view of through-vias 75 which are aligned and joined by selective tungsten connections 68.

The mother substrate 58 may be of semiconductor, metal, or insulating material such as glass or ceramic and may have disposed on/in its surface any desired combination of receptacle segments and conventional hybrid-style components and interconnects. Thus, the concept can be degraded all the way back to the point wherein one is building a conventional multichip hybrid with the key difference being that one or more of the chips is a multisegment superchip in accordance with the invention.

It should be noted in FIG. 16 that if no surface connections of the type 26 are present, then the polymer liquid 20 may be only present to achieve alignment and may be substantially removed for the sake of making CVD metal connections. In this case, the meniscus-surface of the microbridge might not be used as a substrate for conventionally formed interconnections 26. FIG. 16a, wherein lateral selective tungsten interconnections are made has no necessity for a polymer microbridge, as such connections support themselves and require no printing or etching.

Figure 17:
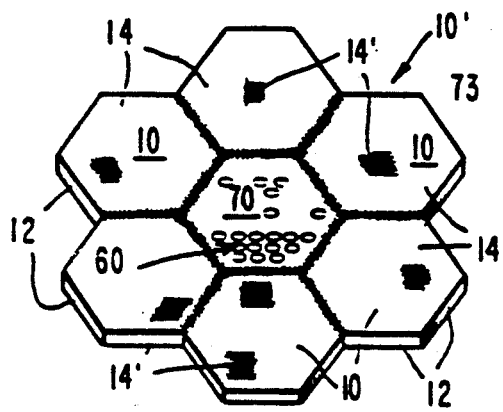
FIG. 17 shows a multisegment superchip in which one segment serves as a connector to adjacent multisegment superchips.
Figure 17A:
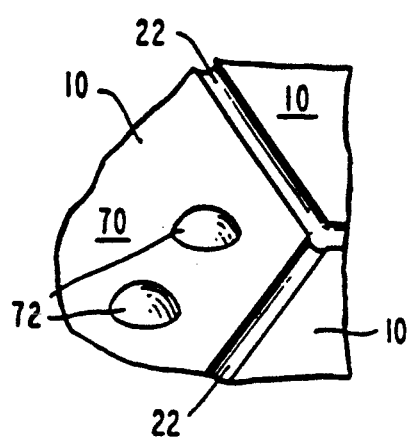
FIG. 17a is an enlargement of a portion of FIG. 17.

In FIG. 17 is shown a multisegment superchip 10' in which one segment 70 serves as a connector to either a substrate or to yet another multisegment superchip. Shown on segment 70 are conventional flip-chip solder bumps 72. Of course, the bumps may be replaced with tape automated bonding (TAB) pads or wire bond pads. It should be clear that special segments such as 70 may also serve to host test circuitry, laser-trimmed precision resistors, electrostatic discharge (ESD) protection circuits, or any other function less conveniently integrated on the other segments. Segment 70 may have electrical contact vias passing completely through it for facilitating both upwards and/or downwards connection.

With regard to forming segments from original parent wafers, the following considerations arise, based on material presented by Fung et al, "Studies in Electrical and Electronic Engineering 2.0—Micromachining and Micropackaging of Transducers", Elsevier Publisher (1985):

The use of wet-chemical selective etching of silicon to form or help-form segments is highly attractive because of the following reasons (1) no particulates produced; (2) mass-production worthy; (3) preciseness governed by lithography only (in the case of V-grooves) or by lithography and either etch-time or an electrochemical etchstop; (4) no substrate damage; and (5) minimal handling risks. Along these lines, one may utilize one of the following three selective wet-etch technologies. They all attack (100) and (110) planes at least 50 times faster than (111) planes.

| ETCH PROCESS | ADVANTAGES | DISADVANTAGES |
| --- | --- | --- |
| KOH/H$_2$O or KOH/H$_2$O/IPA (e.g., 750 g KOH/ 1740 ml H$_2$O/ 510 g IPA @ 80° C.) | Excellent for shallow etching | Attacks oxide at 60 Å/minute Need metal mask for deep etching |
| Hydrazine | None which compensate for danger | VERY dangerous, gives rough surfaces |
| EDP | Attacks oxide at <5 Å/minute Excellent for deep etching | none |

Notes:
IPA = isopropyl alcohol
EDP = ethylene diamine/pyrocatechol/water

On <100> oriented silicon wafers, one obtains V-grooves whose two walls are (111) planes. Typically, an etch temperature for potassium hydroxide/water would be in the 85° to 115° C. range and would give an etch rate of about 1 μm/minute. The etch-rate is a function of temperature. The width of the V-groove is determined by the photomask. Etching stops when the depth is such that the (111) planes meet the resist edges at the defined width.

Two types of etch stops may be used other than the above lithographic ones.

Boron Etch Stop—"EDP" will stop etching in silicon when the boron doping concentration exceeds $5 \times 10^{19}$. A disadvantage is that this much boron creates epitaxial stacking faults. The theory suggests that tensile stress created by the boron is the stopping mechanism.

Electrochemical Etch Stops—Type 1, Isotropic

These etches do not stop, they just slow down; as an example, see R.L. Meek, "Anodic Dissolution of N+ Silicon", J. Electrochem Soc., 118, pp. 437–442, March 1971. These etches will "stop" on a device-quality N-layer.

Electrochemical Etch Stops—Type 2, Anisotropic

These etches do stop; as an example, see T.N. Jackson et al, "An Electrochemical P-N Junction Etch Stop for the Formation of Silicon Microstructures", IEEE ELECTRON DEVICE LETTERS, 2, pp 44–45, February 1981. These etches will truly stop on a device-quality N-layer.

It should be noted that <110> oriented wafers offer the advantage that extremely deep and perpendicular-to-the-surface trenches can be easily wet-etched. However, such trenches do not meet at right angles nor do they have flat bottoms The etch rate ratio of the (110) planes to the (111) planes is >400:1. The disadvantage is that the (110) planes have a higher surface state density, as previously described, than the (100) planes. The following article gives examples of such grooves D.L. Kendall, Annual Review of Mat. Sci., 9, pp. 373–403 (1979). In using <110> oriented wafers, it is extremely important that the mask be aligned to the crystal planes to within 0.1° or the etched trench will be hard to control and the trench walls will be stepped and rough. On the other hand, the width of a V-groove in <100> oriented silicon is controlled not only by the mask width "W" and the perfection of the mask alignment to the (111) planes intersecting the surface, but also by mask erosion, since this crystal orientation does not have as high an intrinsic etch-rate ratio of its crystal planes.

A highly attractive method of making segments is by backside wet-etching them free from their parent wafers after they have been laterally defined from the wafer frontside using anisotropic dry trench-etching or, in the case of <110> oriented material, wet aniostropic trench-etching from the parent wafer frontside.

Figure 18:
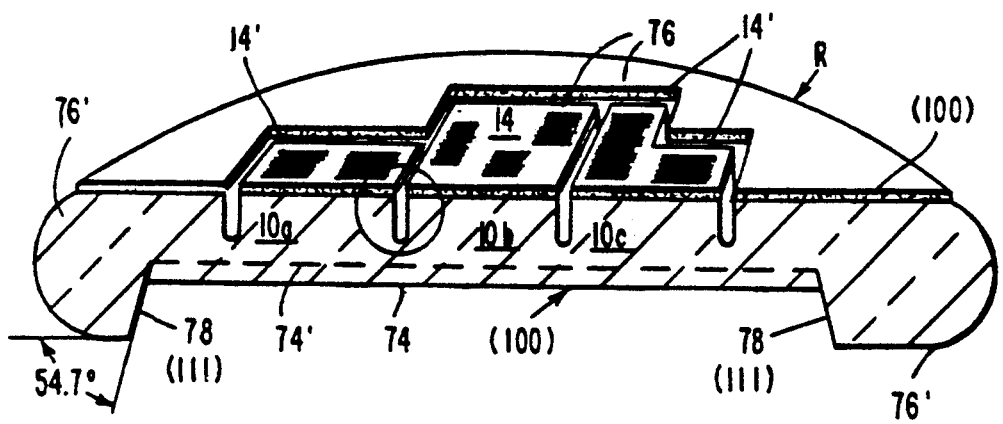
FIG. 18 depicts, in cross-section, a segment parent wafer whose three segments have trench-etching segment delineation from the frontside and blanket selective wet-etching thinning from the wafer backside.

Shown in FIG. 18 is a section of a parent wafer whose multiple segments will become separated when the backside wide-area thinning etch, i.e., wet etch, meets the bottoms of the segment-defining trenches coming from the frontside. It is the frontside trenches which delineate the segment edges.

First, a comparison to the methods depicted in FIG. 3. It will be noted that in FIGS. 3a, 3b, 3a', 3b', and 3c', a trench-etching using dry plasma etching is performed from the frontside (the device side). Then, some selection of techniques employing wafer sawing and/or excimer laser machining is employed from the wafer backside. FIGS. 3a'', 3b'', 3a''', and 3b''' depict a somewhat different strategy wherein the precision surface 12a is not formed until after surface 12b, in order to both simplify the process and prevent 12a damage.

Figure 18A:
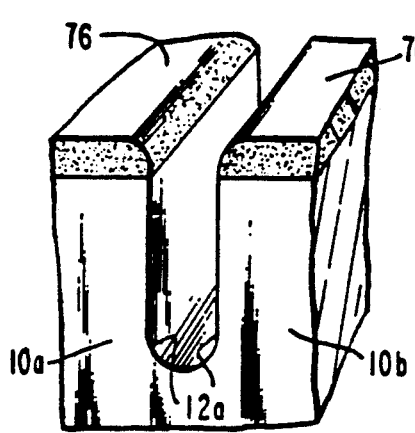
FIG. 18a is an enlargement of a portion of FIG. 18.

FIG. 18 depicts in section a somewhat different approach wherein the same dry anisotropic plasma trenching is employed from the frontside to delineate the segments 10a, 10b and 10c (each of different size). Shown in FIG. 18a, which is an enlargement of the frontside dry-etched delineation trenches, are the precision abutment surface edges 12a which are formed. A major difference in the segment formation technique of FIG. 18 is that there are no segment edges 12b at any point. The bottom surface 74 of the wet-etched large area (when viewed from the wafer backside, it is the bottom) consists of a (100) plane or planes forming a macroscopically smooth surface which moves toward the frontside trenches until they meet and the segments are mechanically freed.

Photoresist or other dry-etch trenching resist 76 is shown on the frontside. On the backside is shown resist 76', which delineates where the large-area wet-thinning etch will take place. It should be noted that in the case of FIG. 18 being a <100> oriented wafer (as shown), then the backside hole which is etched using selective wetetching such as "EDP" wet-chemistry, will have a (100) plane bottom and (111) plane sidewalls (as shown). It should be stressed that in the case of this wafer of FIG. 18 being a <110> oriented wafer, then the frontside trenching could also employ an EDP etch like the backside, but in that case, the walls of the backside holes 78 would be vertical (100) planes.

FIG. 18 has been simplified in the sense that the walls of the backside holes 78 will consist of sets of slow-etching flat (111) planes on a microscopic scale but may appear curved and rough on a macroscopic scale, as the edges of resist 76 are curved do not always align with the (111) plane intersection-lines with the surface other than locally. These off-plane/off-axis etching features are well-known to practitioners of silicon micromechanical selective wet-etches and are described in the above-mentioned references. One cannot etch smooth curved walls and can only approximate them with stepped walls consisting of many different sets of (111).

With respect to FIG. 18, frontside then backside or backside then frontside etching may either be practiced. Optical means may be used to detect the meeting of the two etch-fronts. In either approach, a temporary polymer potting layer (not shown) may be used to backfill the first etch hole(s) or trenches such that the following etch from the opposite side does not result in the segments falling into mechanical disarray. The use of the wet-etchant as a flotation/surface tension assembly liquid or the use of the potting material to perform the same function is within the scope of the invention. It should be stressed that any segment shape is possible in this scheme, including non-rectangular, non-parallelogram varieties such as those with curved edges. For example, a round segment for fitting into a round receptacle of FIG. 16 could be made. The thinning operation defined by resist 76' may involve delineation of multiple large areas separated by a purposely defined support web or grid of unthinned sections. A later stage of backside etching, denoted 74', depicts the frontside/backside etches being even closer to achieving separation.

In the case of abutting two segments of significantly different expansion coefficient or in the case of wide variations between segments in power consumption, thermal cycling or desired operating temperature, then some degree of intersegment shear-strain may occur.

In FIG. 6, the surface of the solidified microgap polymer 22 is shown as approximately parabolic or semicircular. This itself offers strain relief, especially in a direction perpendicular to the gap and near the surface where interconnections 26 reside.

In FIG. 9 is shown an edge-relief technique which will guarantee a minimum length polymer expanse and thus a maximum shear rigidity along the place of the abutted interfaces as felt by interconnect 26 of FIG. 9. Shown in FIG. 14b is yet another technique which is an extension of that in FIG. 9 and which offers additional strain relief along the direction of the abutment shear plane.

It is not necessary that interconnect traces 26 of the Figures, such as FIG. 9, pass across the microgap in a perpendicular fashion. If traces 26 pass across the microgap at an angle other than 90°, then additional flexibility to across-gap compressive or tensile strain (where the gap is pulled shut or pulled open by external influences) is given.

Figure 19:
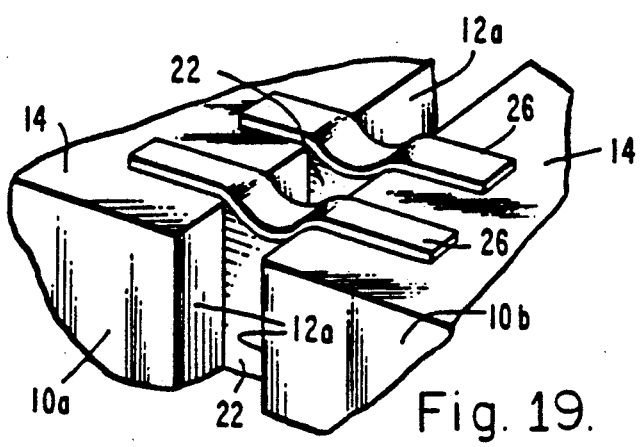
FIG. 19 shows a microgap between segments in which the polymer supporting material is etched away between the interconnect traces using the traces as a mask, thus affording additional strain relief.

Finally, shown in FIG. 19 is a scheme wherein the microgap solidified polymer 22 is etched away between intersegment interconnects 26 using a conventional oxygen or oxygen/Freon RIE plasma etch from above such that additional shear strain relief in the abutment plane is afforded.

It will be noted in FIG. 19 that the interconnect traces 26 pass across the microgap on the solidified gap polymer 22; however, the polymer has been removed between the traces from above (indicated) using a directional oxygen or oxygen/Freon or other reactive ion etching plasma or laser ablation/machining method. The microgap of FIG. 19 may, of course, incorporate the other modifications, such as that shown in FIG. 14b, for example, to further provide even more strain relief.

It is to be stressed that the gap polymer 22 may even be removed to a greater extent than that indicated in FIG. 19, as for example, 100% removal, wherein the polymer is completely ashed isotropically by isotropic oxygen plasma, leaving only an air-bridge, as is used in state-of-the-art gallium arsenide circuits of monolithic design. In such a scheme, the segment positioning would be maintained by first mounting the superchip to a substrate. Even in this scheme, it may be desirable to leave some polymer attached to the bridging traces 26 to damp out the natural vibration frequencies of the hanging traces. A chemically passive etch resist used to define interconnects 26 of FIG. 19 could be left in place on top of the interconnects 26 to do this instead. In yet another variation, polymer 22 may be photoactive so it serves not only the flotation/alignment function but also the function of later selective removal as shown in FIG. 19 but by photochemical means, rather than directional dry-etching means.

Intersegment interconnects 26 are formed using processes and materials known to the art. Typically, the interconnects 26 consist primarily of an aluminum-copper-silicon alloy with a refractory underlayer such as titanium-tungsten or titanium/titanium-nitride. Typical metal deposition thicknesses as deposited in a metal sputterer, evaporator or CVD tool would be $\approx 1500$ Å titanium-tungsten and 10,000 Å of Al-0.5%Cu-1%Si. Typically, the subtractive etching technique is used wherein the metal bilayer is deposited everywhere on the superchip and a patterned photoresist which is then implemented serves as a protective mask during wet-chemical or dry-plasma metal etching. After metal etching, the resist is stripped. This can be done anisotropically in $O_2$ plasma so that the intersegment joint takes on the appearance of FIG. 19.

It should be noted that other methods of implementing thin-film interconnects 26 such as by liftoff or by electroplating into a masked pattern or by laser-writing of refractory or precious metals such as with the laser-deposition of gold, tungsten, molybdenum, copper, aluminum, and chromium are available. In addition to photopyrolysis by laser-writing, new alternatives such as photoactivation/dissociation by UV laser-excitation are available to write patterns of interconnects. The pattern may be written pixel for pixel or may be printed with a mask and large area illumination.

In addition, the use of selective tungsten deposition to bridge the gap even without a solidified microbridge polymer is within the scope of this invention. In this scheme, the flotation liquid 20 is either completely removed after abutment or is etched back from the segment topside to expose mating segment-edge contacts as described previously in FIG. 16a. Selective tungsten deposition would cause the closely abutted mating contacts 64, 64' to grow together. The mushrooming or nail-heading of selective tungsten deposition known in the art would limit the density achievable. The rigidity of such an interface, unless additional flexibility was provided in the form of further mechanical reliefs for shear strain, would also limit the size of such an implementation. This technique is most suitable to the approaches of FIG. 16 or any other approach wherein shear strain is not cumulative over large distances.

The segments, before intersegment interconnects 26 are implemented, must have contacts available on their surfaces for the interconnects 26 to connect to. These contacts may consist of open vias through an insulating layer onto which interconnects 26 will be overlaid and be electrically/physically connected to. This is akin to a second metal in a common device being connected to a first metal at via sites.

Other techniques for forming metallic intersegment interconnects include simply solder-dipping the superchip in a case wherein mating intersegment contacts 64, 64' are provided with solderable metallurgy such as plated gold or copper with an underlying diffusion barrier such as nickel or tungsten. In this approach, one could employ photodefinable or photo-ablatable solidified microbridging polymer much as a solder mask wherein solderable areas are lithographically exposed. The solder could be supplied by printable paste or vacuum evaporation techniques.

Finally, the use of electroplating and/or electroless plating could be used for interconnecting as for gold or nickel plating or electroforming. Again, contacts 64, 64' on mating segments would be closely abutted and aligned due to the action of the flotation liquid. Electroless plating is especially applicable to the contact 64, 64'.

There are countless packaging schemes which could be employed with this invention. With the methods disclosed herein, a superchip can be formed and interconnected. Once the superchip is formed, as in the case of FIG. 5, for example, the superchip can be potted or vacuum-chucked from above such that its bottomside can be freed of excess solidified polymer 22 (if any). A conventional epoxy die attach, for example, could then be executed. In applications wherein all the segments are of equal thickness, then little backside preparation is required before die attach. In cases wherein a potting material is employed, the material may be a hot-melt wax or resin or a thermosetting or UV-curable polymer. A method of solder dieattaching huge chips without using a flux and without resulting in voids has been recently disclosed by Mizuishi et al, "Fluxless and Virtually Voidless Soldering for Semiconductor Chips", IEEE Transactions on Components, Hybrids and Manufacturing Technology, Vol. II, No. 4, Dec. 1988.

The approach of FIGS. 10a and 10b show a good example of where the flotation liquid 20 had a high solvent content such that most of its volume evaporated. The microbridging material 22 is confined to the edges 12. Thus, another substrate which serves to die-attach the superchip could be brought down from above in FIG. 10b such that the additional substrate and segment bottomsides (face-up here) are joined via an adhesive or eutectic predisposed either on the die attach substrate or the segment backsides. Reference surface 36, would maintain superchip planarity during this backside operation.

It is not the goal of this disclosure to outline the various potential packaging schemes, as many already exist if one treats the superchip like any other device, albeit with precautions to address the greater flexural freedom and thus potential for damage afforded by the microbridge joints. The use of reference surfaces, vacuum chucks, and potting materials are but a few ways to provide the superchip protection during packaging.

It should be emphasized that although only a single layer of intersegment interconnects or segment-to-mother substrate interconnects of the types 26 and 64/64' have been shown, there is no reason why, once the superchip or chip/mother substrate is assembled and microbridged, that additional layers of interconnect above 26 or 64/64' cannot be implemented. In fact, the segment/mother substrate assemblage of FIG. 16 could be implemented at any point in the device fabrication process as long as any required later processing ambients and temperatures are compatible with the solidified bridging material if it is to remain in the structure.

The Figures have depicted the implementation of short edge-to-edge intersegment metallic interconnects of the type 26. In these cases, the segments would probably already have their own internal metallizations already implemented such that the segments are testable before they are brought together.

There is no reason why interconnects of the type 26, 64, 64' cannot be more than just segment-to-segment microbridges. Such interconnects may be routed all over the flotation-assembled superchip or segment/mother substrate or superchip/mother substrate assemblages. In this fashion, the fact that what is being wired is an assembly, albeit a pseudomonolithic one, is transparent. It looks like a full, truly monolithic wafer in process. Again, the only pre-flotation assembly segment wiring that must be done is that which insures that each segment being committed to the superchip is a good (yielded) one.

Given that the superchips may be very large, then the lithography tool employed will ideally have a large field size, say 20 mm×20 mm. A good depth of field can be achieved even for submicrometer features using the I-line wavelength. Several exposures may be stitched together as is being explored even for present-day DRAM research and development. There are tradeoffs to be made in the number of exposures/alignments vs. overlay tolerances. A large free-floated (no mother substrate) superchip will have more accumulated dimensional error build-up across it than a mother-substrate approach with only one segment per receptacle. Clever segment arrangement can limit the number of exposures to one, even for a superchip. For example, the seven segment superchip of FIG. 17 might have only one alignment target on the central segment, since every other segment is only one microbridge's worth of positional error away. Conversely, for even more accuracy, one may, at the other extreme, align and expose each individual abutment interface using alignment targets situated on both sides of a given particular gap. Hexagonal segments, as shown in FIG. 17, are forgiving in the sense that there cannot be long-range tolerance build-ups, because the segment seams are randomly (120°) oriented and errors are distributed equally in all directions.

So far, the emphasis has been on microgap interconnects implemented on the device-face of the segments. An application is now described wherein multiple segments are stacked directly on top of each other to create a silicon (or other semiconductor) stack on whose edges are implemented microgap-style connections.

It will be recalled that the flotation/alignment liquid is denoted 20 and the solidified microbridge material (shown in FIG. 20) is denoted 22. Those may or may not be the same material.

In FIG. 20, three segments 10a-c are shown on edge. The precision-defined edges 12a are, however, not abutted face to face. Instead, precision abutment edges 12a are rendered coplanar (i.e., to be co-existing in the datum plane 80) by an independent reference surface 36' such as shown in FIGS. 11 and 12 with the help of a liquid alignment agent 20. A major difference with all previous figures is that the microbridging material does not wet the surface 12a of the segments or if it does, it is forcefully displaced by independent alignment reference surface 36'. In this case, the "flotation liquid" 20 may or may not actually float the segments;, what is important is that the liquid 20 (to be solidified into polymer 22) here wets major predefined portions of the wide surfaces of the segments, pulling them together by capillary action. It thus forms a continuous bridging layer at least across the gaps on the stack edges, which are to support interconnections 26.

The segments 10a-c of FIG. 20 may reside standing on edge, in a deep receptacle in the surface of a mother substrate 58, a portion of which is indicated in FIG. 20. In this case, datum plane 80 is coplanar with the surface of the substrate 58.

A particular strength of the foregoing approach is that there will be no appreciable strain on the interconnects 26 due to bending movements applied to the packaged stack of segments 10. This is because the stack is relatively rigid. It should be noted that edges 12a in FIG. 20 must be insulating such that traces 26 are not shorted. In order to connect the traces 26 to the circuitry on each segment 10, the segment frontside interconnects may be brought to the edge 12a such that it is edge-exposed as previously depicted as 64 in FIG. 16. Power dissipation is more difficult to deal with in a three dimensional stack of this type than for a two-dimensional array of segments.

Finally, it may be desirable to form superchips from a first segment and one or more segments containing test circuitry using the procedures disclosed herein, test the first segment, and separate the segments. The first segment is then processed further. Such forming of superchips for testing is also within the scope of this invention.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in any combination of digital, analog, or electrooptical device technologies, superconducting technologies, solid-state sensor technologies, or micromechanical device technologies, to name but a few. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A method for coplanar integration of semiconductor IC devices comprising:
    (a) providing at least segments, each having at least one edge having an abutting portion capable of abutting against a similar edge of a neighboring segment, each segment having on a top surface thereof at least one of the items selected from the group consisting of circuits, circuit elements, sensors, and input/output connections;
    (b) providing a mother substrate having openings formed therein to accept said segments in stacked array;
    (c) placing said segments in said openings in said mother substrate; and
    (d) forming electrical interconnections between neighboring segments so as to interconnect various of said circuits, circuit elements, sensors, and input/output connections.

2. The method of claim 1 wherein said segments are mechanically secured in said openings by a solid microbridge.

3. The method of claim 2 wherein said solid microbridge is formed by introducing a liquid between said segments and between said segments and said substrate and treated to form said solid microbridge.

4. The method of claim 3 wherein said microbridge material is characterized by the properties of semiconductor electronic-grade ionic and particulate cleanliness and is a dielectric.

5. The method of claim 4 wherein said microbridge material is selected from the group consisting of polyimides, polyimide precursors, epoxies, UV- and heat-curable polymers, and silica.

6. The method of claim 1 wherein said electrical interconnections include selective tungsten.

7. The method of claim 6 wherein said segments and said substrate are provided with edge contacts, a portion of which edge contacts is trenched into said segments and said substrate along an edge thereof and said electrical interconnections include interconnecting edge contacts on said segments and on said substrate.

8. The method of claim 1 wherein said segments are placed on one edge in said openings to expose an upper edge thereof and at least some of said electrical interconnections are formed along said upper edges.

* * * * *